US009279549B2

(12) United States Patent
Sugiura

(10) Patent No.: US 9,279,549 B2
(45) Date of Patent: Mar. 8, 2016

(54) LIGHT-EMITTING MODULE WITH WAVELENGTH CONVERTERS AND LIGHT-ABSORBING SUBSTANCE

(71) Applicant: PANASONIC CORPORATION, Osaka (JP)

(72) Inventor: Kenji Sugiura, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/105,356

(22) Filed: Dec. 13, 2013

(65) Prior Publication Data

US 2014/0167599 A1 Jun. 19, 2014

(30) Foreign Application Priority Data

Dec. 19, 2012 (JP) ................. 2012-276709

(51) Int. Cl.
*F21K 99/00* (2010.01)
*H05B 33/10* (2006.01)
(Continued)

(52) U.S. Cl.
CPC ............... *F21K 9/56* (2013.01); *H01L 33/504* (2013.01); *H05B 33/10* (2013.01); *H05B 33/14* (2013.01);
(Continued)

(58) Field of Classification Search
CPC ..... H01L 33/508; H01L 33/60; H01L 33/504; H01L 25/0753; H01L 33/502; H01L 33/507; F21K 9/56; H05B 33/10; H05B 33/14
USPC .......................................... 313/512, 498–511
See application file for complete search history.

(56) References Cited

U.S. PATENT DOCUMENTS 7,250,715 B2 * 7/2007 Mueller et al. ................. 313/485
8,013,515 B2 * 9/2011 Tanimoto ............... H01L 33/504
313/501

(Continued)

FOREIGN PATENT DOCUMENTS

EP 1865564 A1 12/2007
JP 11-73923 A 3/1999
(Continued)

OTHER PUBLICATIONS

Kiyoko et al, Japanese Patent Application Publication 2010-040558, Jul. 2008, machine translation.*

(Continued)

*Primary Examiner* — Tracie Y Green
(74) *Attorney, Agent, or Firm* — Greenblum & Bernstein, P.L.C.

(57) ABSTRACT

A light-emitting module includes a light-emitting element, a first wavelength converter and a second wavelength converter. The first wavelength converter is located in an optical pathway of emitted light, and converts a portion of the emitted light to light in a first visible wavelength band. The second wavelength converter is located in the optical pathway on an opposite side of the first wavelength converter relative to the light-emitting element, and converts at least a portion of light passing unconverted through the first wavelength converter to light in a second visible wavelength band, differing from the first visible wavelength band. The light-emitting module also includes a light-absorbing substance, absorbing light in at least a wavelength band from 570 nm to 590 nm, which is present in the optical pathway between the light-emitting element and the second wavelength converter, the second wavelength converter not containing the light-absorbing substance.

17 Claims, 18 Drawing Sheets

(51) Int. Cl.
*H05B 33/14* (2006.01)
*H01L 25/075* (2006.01)
*H01L 33/50* (2010.01)

(52) U.S. Cl.
CPC .......... *H01L 25/0753* (2013.01); *H01L 33/502* (2013.01); *H01L 33/507* (2013.01); *H01L 2924/0002* (2013.01)

(56) References Cited

U.S. PATENT DOCUMENTS

| | | | |
|---|---|---|---|
| 8,169,135 B2 * | 5/2012 | Zhai et al. | 313/501 |
| 8,215,798 B2 * | 7/2012 | Rains, Jr. | F21K 9/00 362/293 |
| 2004/0119086 A1 * | 6/2004 | Yano et al. | 257/98 |
| 2007/0278935 A1 * | 12/2007 | Harada | C09K 11/0883 313/503 |
| 2009/0184333 A1 * | 7/2009 | Wang | H01L 33/508 257/88 |
| 2011/0025951 A1 * | 2/2011 | Jones | 349/70 |
| 2011/0133628 A1 * | 6/2011 | Klein et al. | 313/483 |
| 2011/0156071 A1 | 6/2011 | Cheng et al. | |
| 2011/0309390 A1 * | 12/2011 | Liu | H01L 25/0753 257/89 |
| 2012/0007130 A1 * | 1/2012 | Hoelen | H01L 33/504 257/98 |
| 2012/0155061 A1 * | 6/2012 | Manabe | F21K 9/135 362/84 |
| 2012/0300432 A1 | 11/2012 | Matsubayashi et al. | |

FOREIGN PATENT DOCUMENTS

| | | |
|---|---|---|
| JP | 2012-199288 A | 10/2012 |
| WO | 2011/108203 A1 | 9/2011 |

OTHER PUBLICATIONS

Extended European Search Report for EP 13198366.0, dated Jun. 11, 2014.

* cited by examiner

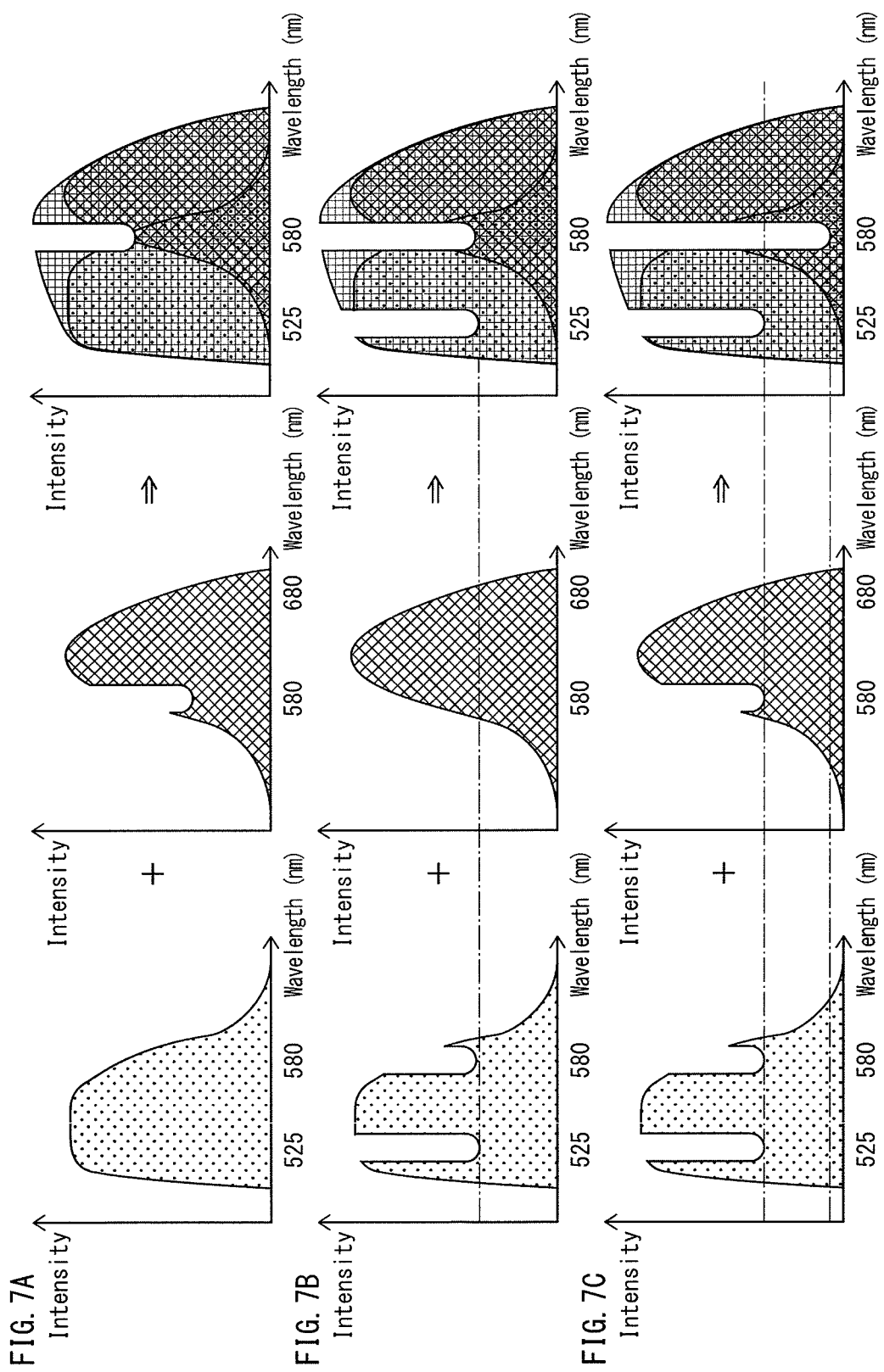

LIGHT-EMITTING MODULE WITH WAVELENGTH CONVERTERS AND LIGHT-ABSORBING SUBSTANCE

TECHNICAL FIELD

The present invention relates to a light-emitting module and a lighting source which includes the light-emitting module. In particular, the present invention relates to an art of lighting in shops and other locations.

BACKGROUND ART

A lighting source which emits white light is conventionally used in shops and other locations. For example, in a shop which displays products such as food, a lighting source which emits white light having a high saturation may be used to implement shop lighting in order that the food products have vivid colors when viewed.

As one example of a lighting source of the type described above, a lighting source has been proposed which includes a filter having a light-transmitting base material in which neodymium oxide is dispersed (refer to International Publication No. WO2011/108203).

The lighting source disclosed in WO2011/108203 includes a light-emitting unit which is covered by the filter. The filter absorbs light in a specific wavelength band (570 nm to 590 nm) from among white light emitted from the light-emitting unit. Through the above, the lighting source is able to emit white light having a high saturation. One example of an index which can be used to express saturation is a feeling of contrast index (FCI) (refer to Japanese Patent Application Publication No. H11-73923). Reduction in radiant intensity of white light in the specific wavelength band from 570 nm to 590 nm, results in an improved FCI value for the white light.

SUMMARY OF INVENTION

Technical Problem

Unfortunately, in the lighting source recited in International Publication No. WO2011/108203, a portion of the white light is absorbed by the filter, thus light-extraction efficiency from the light-emitting unit is reduced by an amount in accordance with the absorption.

On the other hand, in a configuration which prioritizes light-extraction efficiency by not including a filter, radiant intensity is high in the aforementioned specific wavelength band from 570 nm to 590 nm, causing reduced saturation of white light.

The present invention was achieved in consideration of the above problem, and an aim thereof is to provide a light-emitting module that improves light-extraction efficiency while also suppressing reduction in saturation of emitted white light.

Solution to Problem

A light-emitting module relating to one aspect of the present invention comprises: a light-emitting element configured to emit light; a first wavelength converter located in an optical pathway along which the light emitted from the light-emitting element passes, and configured to convert a portion of the light emitted from the light-emitting element to light in a first visible wavelength band; a second wavelength converter located in the optical pathway on an opposite side of the first wavelength converter relative to the light-emitting element, and configured to convert at least a portion of light passing unconverted through the first wavelength converter to light in a second visible wavelength band, differing from the first visible wavelength band; and a light-absorbing substance absorbing light in at least a wavelength band from 570 nm to 590 nm, wherein the light-absorbing substance is present in the optical pathway between the light-emitting element and the second wavelength converter, the second wavelength converter not containing the light-absorbing substance.

Advantageous Effects of Invention

In the configuration described above, the light-absorbing substance, which absorbs light in at least the wavelength band from 570 nm to 590 nm, is present between the light-emitting element and the second wavelength converter, the second wavelength converter not containing the light absorbing substance. As a result, among the light emitted from the light-emitting element, light which is converted by the second wavelength converter is extracted externally from the light-emitting module without being affected by absorption by the light-absorbing substance. On the other hand, among the light emitted from the light-emitting element, light which is converted by the first wavelength converter is affected by absorption by the light-absorbing substance. Thus, light in at least the wavelength band from 570 nm to 590 nm is absorbed from among the light converted by the first wavelength converter, and light in other wavelength bands is extracted externally from the light-emitting module. As a result of the above, light-extraction efficiency can be increased by an amount in accordance with an amount of light converted by the second wavelength converter and extracted externally from the light-emitting module unaffected by absorption. Furthermore, radiant intensity of light converted by the first wavelength converter is reduced in at least the wavelength band from 570 nm to 590 nm due to the light-absorbing substance. As a consequence, reduction in saturation of white light extracted externally from the light-emitting module is suppressed by an amount in accordance with light-absorption by the light-absorbing substance.

BRIEF DESCRIPTION OF DRAWINGS

FIG. 7A illustrates a spectral distribution for the light-emitting module relating to the first example of the first embodiment, FIG. 7B illustrates a spectral distribution for the light-emitting module relating to the second example of the first embodiment, and FIG. 7C illustrates a spectral distribution for the light-emitting module relating to the comparative example.

DESCRIPTION OF EMBODIMENTS

<First Embodiment>

Figure 1:
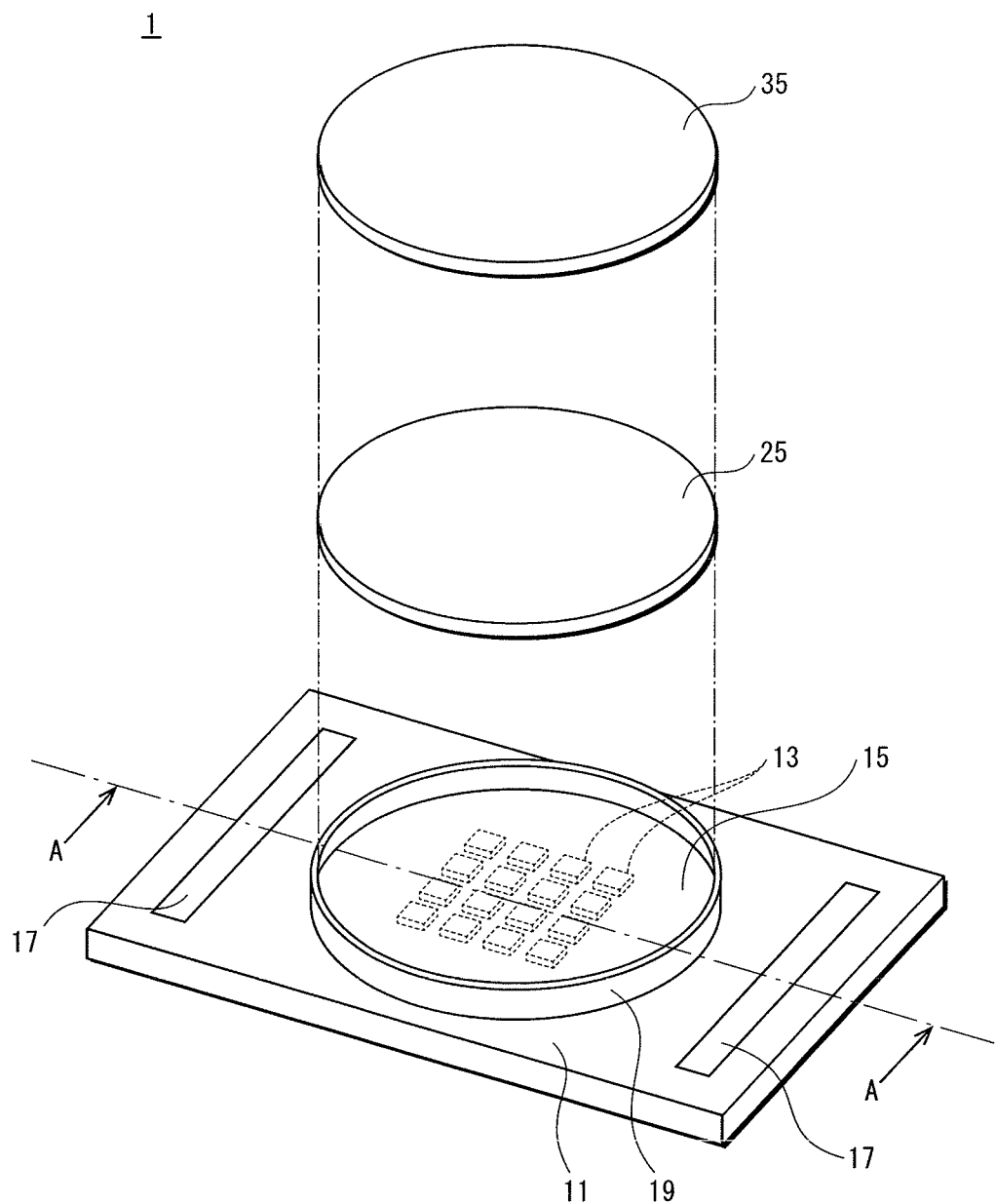
FIG. 1 is an exploded perspective diagram illustrating a light-emitting module relating to a first embodiment.
Figure 2:
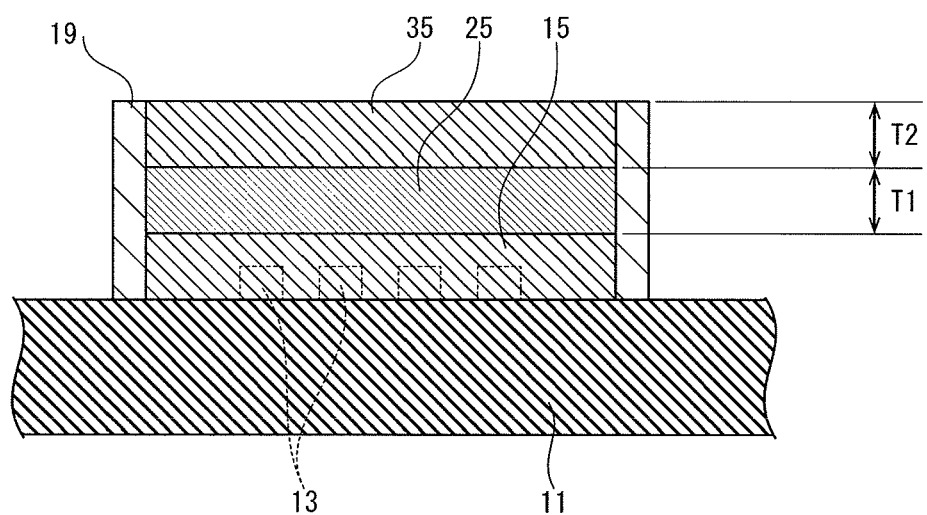
FIG. 2 illustrates, for the light-emitting module relating to the first embodiment, one part of a cross-section A-A indicated in FIG. 1.

FIG. 1 is an exploded perspective diagram illustrating a light-emitting module 1 relating to the present embodiment. FIG. 2 illustrates, for the light-emitting module 1, one part of a cross-section A-A indicated in FIG. 1.

The light-emitting module 1 includes a substrate 11, a plurality of light-emitting diodes (LEDs) 13, a sealing member 15, electrode pads 17, a frame 19, and wavelength converters 25 and 35.

The substrate 11 has a rectangular shape. The substrate 11 for example has a two layer structure including a plate part, which is made of a metal such as aluminum, and an insulating film, which is made of an insulating material such as polycarbonate. The insulating film entirely covers a surface of the plate part on which the LEDs 13 are to be mounted. Alternatively, the substrate 11 may be made of an insulating material such as a resin or ceramic, thus having a single uniform structure.

The LEDs 13 are GaN LEDs that emit blue light having a wavelength in a blue light wavelength band (410 nm to 500 nm, or more specifically from 440 nm to 460 nm), which is one part of a visible wavelength band (400 nm to 780 nm). The LEDs 13 are mounted on the substrate 11.

The sealing member 15 is made from a resin material which is transparent with respect to light of all wavelengths in the visible wavelength band from 400 nm to 780 nm. The resin material may for example be a silicone resin, fluororesin, silicone-epoxy hybrid resin or urea resin. The sealing member 15 is located such as to cover the LEDs 13. By sealing the LEDs 13 using the sealing member 15 which is transparent, blue light emitted from the LEDs 13 is guided throughout the sealing member 15 reducing uneven brightness.

The electrode pads 17 are located on the substrate 11, externally to the frame 19. The electrode pads 17 supply electrical power to the LEDs 13.

The frame 19 has an annular shape in plan-view and is located such as to surround a circumference of the sealing member 15. The frame 19 is made of an insulating material, such as white polycarbonate, which is of a color having a high reflectivity with respect to visible light.

The wavelength converters 25 and 35 each have an approximately circular disc shape and are each fitted inside the frame 19 which is annular in plan-view. The wavelength converter 25 is located such as to cover the LEDs 13 and the sealing member 15, and the wavelength converter 35 is located such as to cover the wavelength converter 25. In other words, the wavelength converter 25 is located in an optical pathway of light emitted from the LEDs 13, and the wavelength converter 35 is located in the optical pathway on an opposite side of the wavelength converter 25 relative to the LEDs 13.

The wavelength converter 25 converts one portion of blue light emitted from the LEDs 13 to light in a first visible wavelength band. The first visible wavelength band may for example be a wavelength band from 480 nm to 630 nm (referred to below as a short wavelength band), or may be a wavelength band from 540 nm to 780 nm (referred to below as a long wavelength band). The one portion of blue light emitted from the LEDs 13 is converted to light in the first visible wavelength band by the wavelength converter 25. A remaining portion of blue light emitted from the LEDs 13 passes through the wavelength converter 25 without being converted. The wavelength converter 35 converts blue light which passes unconverted through the wavelength converter 25 to light in a second visible wavelength band. The second visible wavelength band differs from the first visible wavelength band and may for example be the short wavelength band or the long wavelength band. For example, in a configuration in which the first visible wavelength band is the long wavelength band, the second visible wavelength band is the short wavelength band. Conversely, in a configuration in which the first visible wavelength band is the short wavelength band, the second visible wavelength band is the long wavelength band. Consequently, the light-emitting module 1 emits white light which is a mixture of blue light, light in the first visible wavelength band, and light in the second visible wavelength band.

In the present embodiment, each of the wavelength converters 25 and 35 includes a light-transmitting base material and a phosphor which is dispersed within the light-transmitting base material. The phosphor is for example a phosphor which converts blue light to light in the short wavelength band (referred to below as a short wavelength phosphor), or a phosphor which converts blue light to light in the long wavelength band (referred to below as a long wavelength phosphor). The light-transmitting base material is for example made of light-transmitting glass or ceramic, or alternatively may be made of a light-transmitting resin material such as a silicone resin, fluororesin, silicone-epoxy hybrid resin or urea resin. For each of the wavelength converters 25 and 35, a phosphor included therein is selected in accordance with a wavelength band to which the aforementioned wavelength converter performs conversion.

The wavelength converter 25 further includes a light-absorbing substance which absorbs light in at least a wavelength band from 570 nm to 590 nm. The light-absorbing substance is dispersed within the light-transmitting base material, which configures one part of the wavelength converter 25. In contrast to the wavelength converter 25, the wavelength converter 35 does not include the light-absorbing substance. Therefore, in the above configuration in which the wavelength converter 25 includes the light-absorbing substance, but the wavelength converter 35 does not include the light-absorbing substance, the light-absorbing substance is present in the optical pathway of light emitted from the LEDs 13 between the LEDs 13 and the wavelength converter 35, the wavelength converter 35 not containing the light-absorbing substance. Furthermore, the wavelength band in which the light-absorbing substance absorbs light is set based on a target saturation of white light emitted from the light-emitting module 1, and in order to improve the saturation of the white light, it is necessary to reduce radiant intensity in at least the wavelength band from 570 nm to 590 nm. In the present embodiment, the light-absorbing substance is neodymium oxide, which a neodymium compound that absorbs light in a wavelength band from 515 nm to 535 nm and also in a wavelength band from 570 nm to 590 nm. An amount of neodymium oxide in the wavelength converter 25 is set based on the target saturation of white light emitted from the light-emitting module 1. For example, the amount of neodymium oxide is increased in a configuration in which further reduction in radiant intensity is desired in the wavelength band from 570 nm to 590 nm.

Furthermore, a spectral distribution of white light emitted from the light-emitting module 1 can be adjusted by varying phosphor concentration and thickness T1 of the wavelength converter 25, and also by varying phosphor concentration and thickness T2 of the wavelength converter 35.

The following explains two examples (a first example and a second example) of the light-emitting module 1 relating to the present embodiment, through comparison with a light-emitting module relating to a comparative example. In the following explanation, the light-emitting module 1 and the wavelength converters 25 and 35 as relating to the first example are referred to respectively as a light-emitting module 1A, and wavelength converters 25A and 35A. Likewise, the light-emitting module 1 and the wavelength converters 25 and 35 as relating to the second example are referred to respectively as a light-emitting module 1B, and wavelength converters 25B and 35B.

Figure 3:
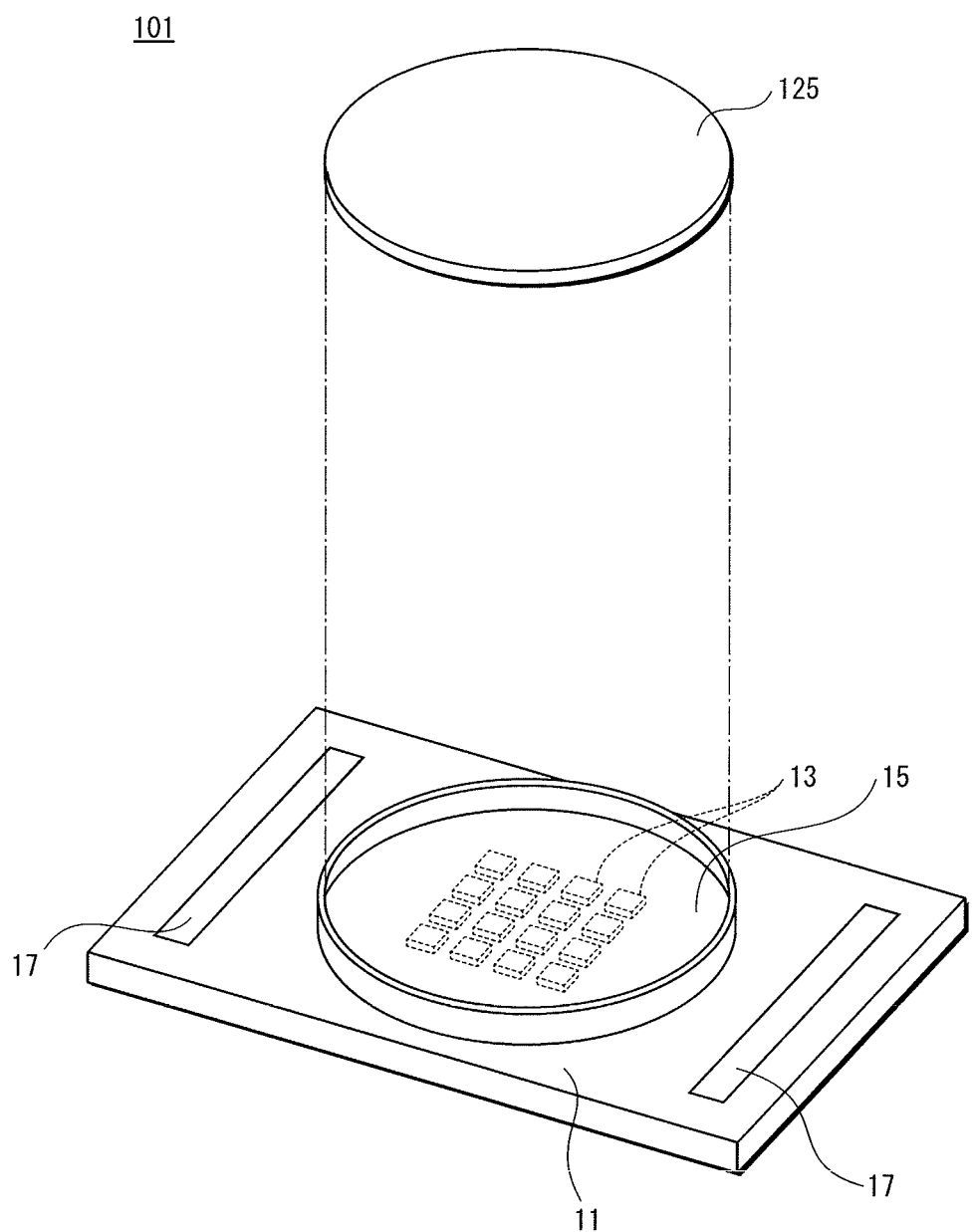
FIG. 3 is an exploded perspective diagram illustrating a light-emitting module relating to a comparative example.

FIG. 3 is an exploded perspective diagram illustrating a light-emitting module 101 relating to the comparative example. Configuration elements which are the same as in the present embodiment are labeled using the same reference signs and explanation thereof is omitted. The light-emitting module 101 relating to the comparative example differs from the present embodiment in terms that the light-emitting module 101 only includes one wavelength converter 125.

The wavelength converter 125 is located such as to cover a plurality of LEDs 13 and a sealing member 15. The wavelength converter 125 includes a light-transmitting base material, and also phosphors and neodymium oxide which are dispersed within the light-transmitting base material. A material used to form the light-transmitting base material is the same as described for the present embodiment.

[First Example]
(Structure)

In the light-emitting module 1A relating to the first example, the wavelength converter 25A includes a long wavelength phosphor and neodymium oxide, and the wavelength converter 35A includes a short wavelength phosphor. A thickness T1 of the wavelength converter 25A is approximately the same as a thickness T2 of the wavelength converter 35A. Concentration of the long wavelength phosphor in the wavelength converter 25A is in a range of 5% to 6% by weight. Concentration of the short wavelength phosphor in the wavelength converter 35A is in a range of 15% to 20% by weight. The concentrations of the long wavelength phosphor and the short wavelength phosphor described above are for a configuration in which a color temperature of white light emitted from the light-emitting module 1A is set at approximately 3000 K. In a configuration in which color temperature of white light emitted from the light-emitting module 1A is for example set at 5000 K or 6500 K, preferably the aforementioned concentrations should be altered.

The long wavelength phosphor may for example be a sulfide phosphor such as $(Sr,Ca)S:Eu^{2+}$ or $La_2O_2S:(Eu^{3+},Sm^{3+})$, a silicate phosphor such as $Ba_3MgSi_2O_8:Eu^{2+}$ $(Mn^{2+})$, or a nitride (oxynitride) phosphor such as $(Ca,Sr)SiN_2:Eu^{2+}$, $(Ca,Sr)AlSiN_3:Eu^{2+}$ or $Sr_2Si_{5-x}Al_xO_xN_{8-x}:Eu^{2+}$ ($0 \le x \le 1$).

The short wavelength phosphor may be an aluminate phosphor such as $BaMgAl_{10}O_{17}(Eu^{2+},Mn^{2+})$ or $(Ba,Sr,Ca)Al_2O_4:Eu^2)$, a silicate phosphor such as $(Ba,Sr)_2SiO_4:Eu^{2+}$, an α-sialon phosphor such as $Sr_{1.5}Al_3Si_9N_{16}:Eu^{2+}$ or Ca-α-SiAlON:$Yb^{2+}$, a β-sialon phosphor such as $\beta\text{-}Si_3N_4:Eu^{2+}$, an oxynitride phosphor such as $(Ba,Sr,Ca)Si_2O_2N_2:Eu^{2+}$, $(Ba,Sr,Ca)_2Si_4AlON_7:Ce^{3+}$ or $(Ba,Sr,Ca)Al_{2-x}Si_xO_{4-x}N_x:Eu^{2+}$ ($0<x<2$), a nitride phosphor such as $(Ba,Sr,Ca)_2Si_5N_8:Ce^{3+}$, a sulfide phosphor such as $SrGa_2S_4:Eu^{2+}$, a garnet phosphor such as $Ca_3Sc_2Si_3O_{12}:Ce^{3+}$, $BaY_2SiAl_4O_{12}:Ce^{3+}$, $Y_3(Al,Ga)_5O_{12}:Ce^{3+}$, $Lu_3(Al,Ga)_5O_{12}:Ce^{3+}$ or $Tb_3(Al,Ga)_5O_{12}:Ce^{3+}$, or an oxide phosphor such as $CaSc_2O_4:Ce^{3+}$.

In contrast, in the comparative example the wavelength converter 125 includes a long wavelength phosphor, a short wavelength phosphor and neodymium oxide. The long wavelength phosphor, the short wavelength phosphor and the neodymium oxide are dispersed within the light-transmitting base material.

Figure 4A:
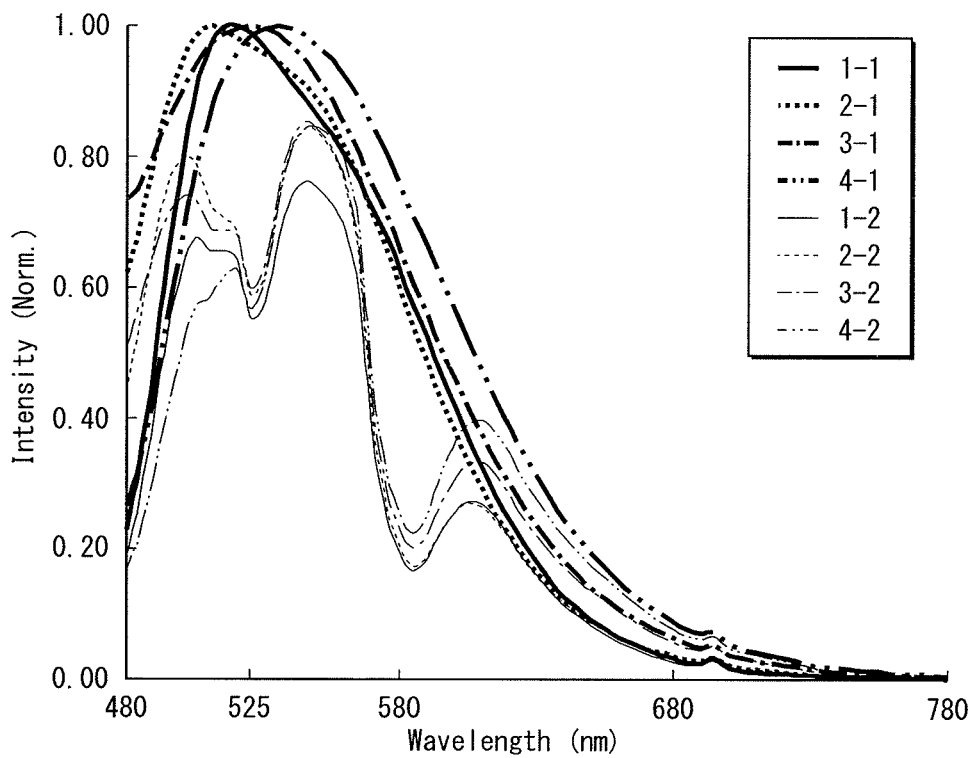
FIG. 4A illustrates spectral distributions in configurations in which a wavelength converter is used which includes a short wavelength phosphor, but does not include neodymium oxide, and spectral distributions in configurations in which a wavelength converter is used which includes both a short wavelength phosphor and neodymium oxide.
Figure 4B:
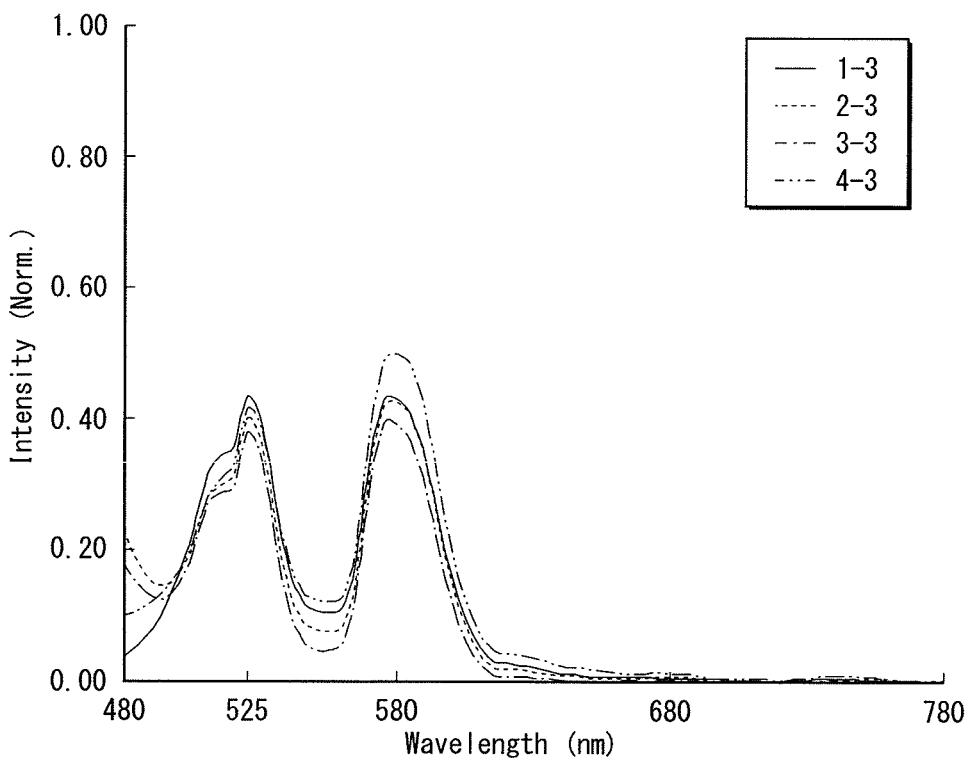
FIG. 4B illustrates difference between the spectral distributions illustrated in FIG. 4A.

(Light-Extraction Efficiency of the Light-Emitting Module Relating to the First Example FIG. 4A illustrates spectral distributions in configurations in which a wavelength converter is used which includes a short wavelength phosphor, but does not include neodymium oxide, and spectral distributions in configurations in which a wavelength converter is used which includes a short wavelength phosphor and neodymium oxide. FIG. 4B illustrates difference between the spectral distributions illustrated in FIG. 4A. In FIGS. 4A and 4B radiant intensity is indicated on a vertical axis and light wavelength is indicated on a horizontal axis. In FIG. 4A, curves "k–1" (k=1, 2, 3, 4) illustrate spectral distributions of light emitted from wavelength converters which each include a different short wavelength phosphor. Curves "k–2" (k=1, 2, 3, 4) each illustrate a spectral distribution of light emitted from a corresponding one of the wavelength converters illustrated by the curves "k–1" (k=1, 2, 3, 4) when neodymium oxide is added to the corresponding wavelength converter. In FIG. 4B, curves "k–3" (k=1, 2, 3, 4) each illustrate difference between a corresponding one of the spectral distributions "k–1" and a corresponding one of the spectral distributions "k–2".

As illustrated in FIGS. 4A and 4B, in the spectral distributions of light emitted from the wavelength converters which each include a short wavelength phosphor and neodymium oxide, radiant intensity is reduced in the wavelength band from 515 nm to 535 nm and the wavelength band from 570 nm to 590 nm, compared to the spectral distributions of light emitted from the wavelength converters which each include a short wavelength phosphor, but not neodymium oxide.

Figure 5A:
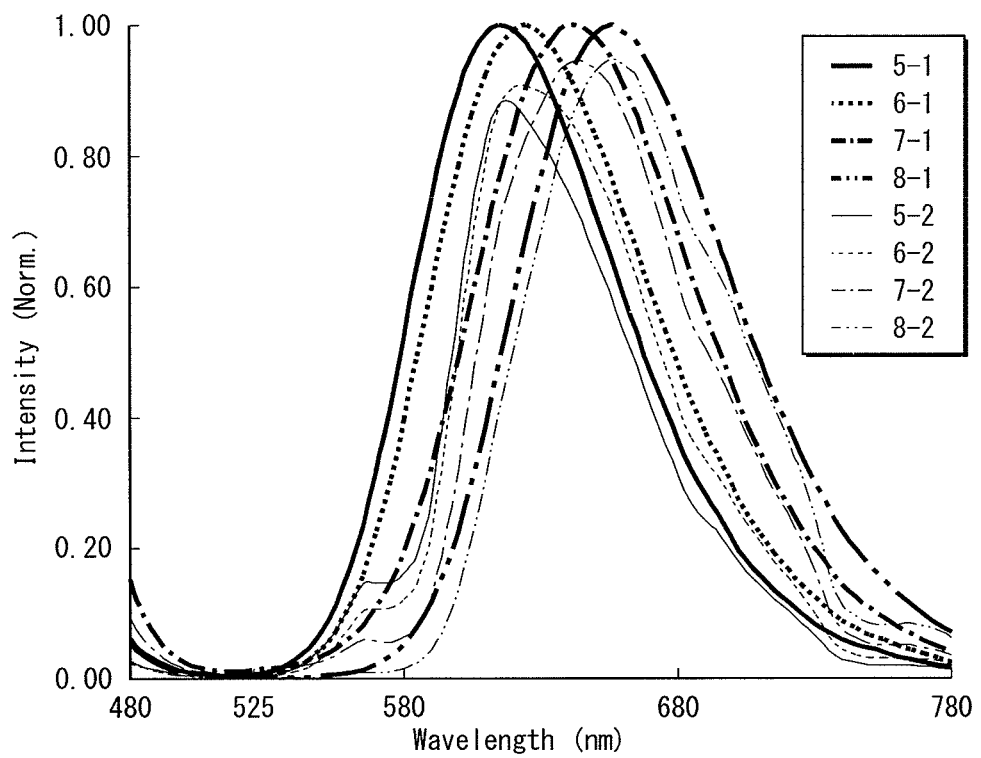
FIG. 5A illustrates spectral distributions in configurations in which a wavelength converter is used which includes a long wavelength phosphor, but does not include neodymium oxide, and spectral distributions in configurations in which a wavelength converter is used which includes both a long wavelength phosphor and neodymium oxide.
Figure 5B:
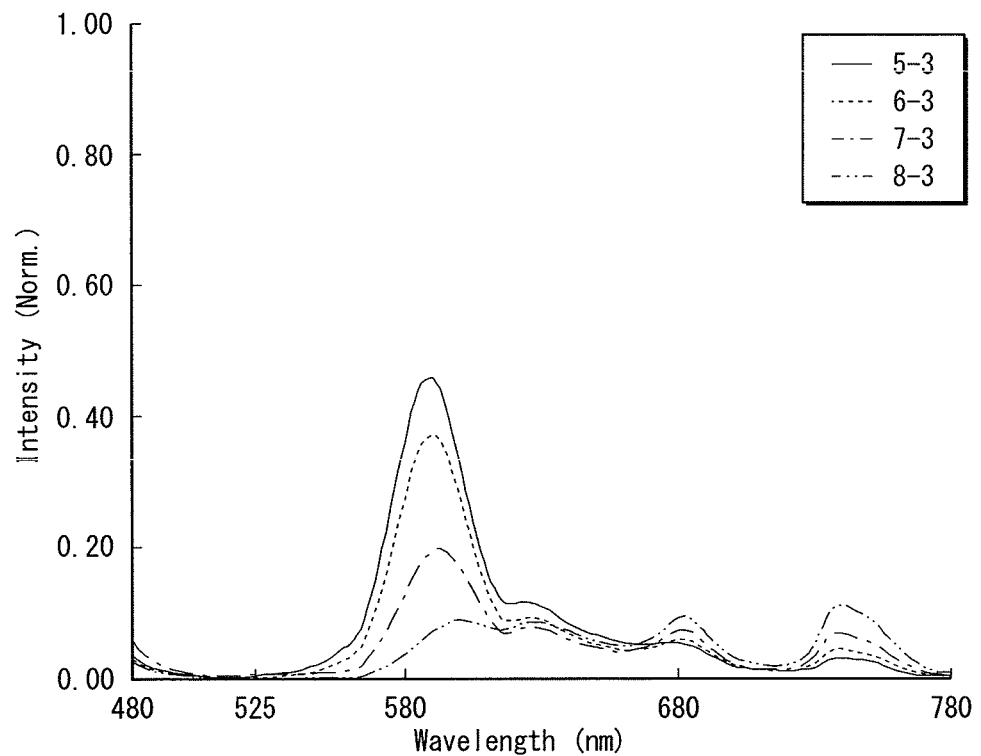
FIG. 5B illustrates difference between the spectral distributions illustrated in FIG. 5A.

FIG. 5A illustrates spectral distributions in configurations in which a wavelength converter is used which includes a long wavelength phosphor, but does not include neodymium oxide, and spectral distributions in configurations in which a wavelength converter is used which includes a long wavelength phosphor and neodymium oxide. FIG. 5B illustrates difference between the spectral distributions illustrated in FIG. 5A. In FIGS. 5A and 5B radiant intensity is indicated on a vertical axis and light wavelength is indicated on a horizontal axis. In FIG. 5A, curves "k–1" (k=5, 6, 7, 8) illustrate spectral distributions of light emitted from wavelength converters which each include a different long wavelength phosphor. Curves "k–2" (k=5, 6, 7, 8) each illustrate a spectral distribution of light emitted from a corresponding one of the wavelength converters illustrated by the curves "k–1" when neodymium oxide is added to the corresponding wavelength converter. In FIG. 5B, curves "k–3" (k=5, 6, 7, 8) each illustrate difference between a corresponding one of the spectral distributions "k–1" and a corresponding one of the spectral distributions "k–2".

As illustrated in FIGS. 5A and 5B, in the spectral distributions of light emitted from the wavelength converters which each include a long wavelength phosphor and neodymium oxide, radiant intensity in reduced in the wavelength band from 570 nm to 590 nm, compared to the spectral distributions of light emitted from the wavelength converters which each include a long wavelength phosphor, but not neodymium oxide. Also, in the spectral distributions of light emitted from the wavelength converters which each include a long wavelength phosphor but not neodymium oxide, radiant intensity in the wavelength band from 515 nm to 535 nm is less than half (50%) of radiant intensity at a peak wavelength and is close to zero. Therefore, even if neodymium oxide is added to any of the wavelength converters which each include a long wavelength phosphor but not neodymium oxide, radiant intensity in the wavelength band from 515 nm to 535 nm is already close to zero prior to the addition, and consequently, light-absorption by the neodymium oxide does not significantly affect radial intensity in the wavelength band from 515 nm to 535 nm.

Figure 6A:
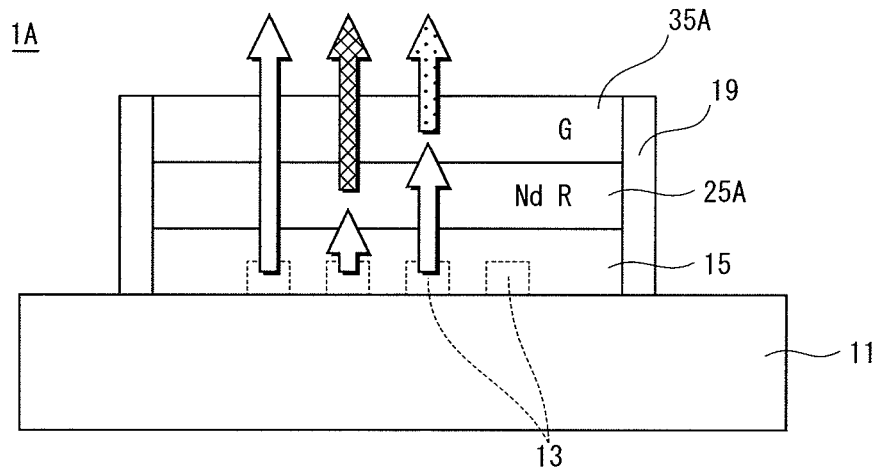
FIG. 6A illustrates light conversion in a light-emitting module relating to a first example of the first embodiment.
Figure 6B:
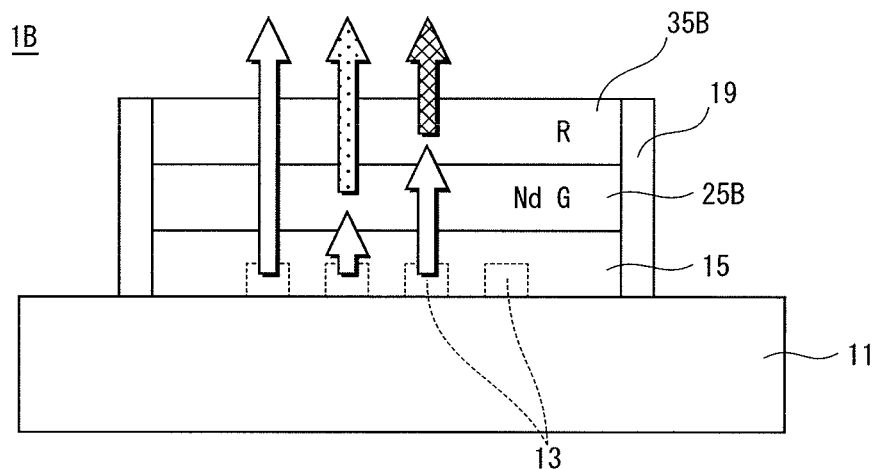
FIG. 6B illustrates light conversion in a light-emitting module relating to a second example of the first embodiment.
Figure 6C:
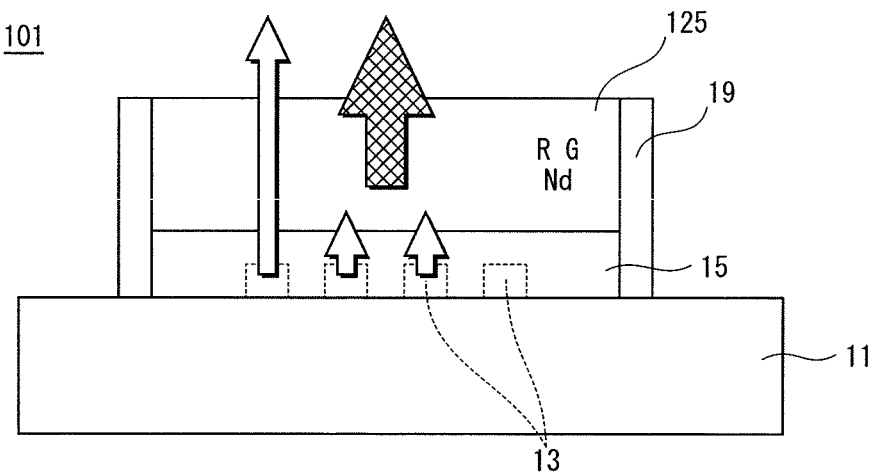
FIG. 6C illustrates light conversion in the light-emitting module relating to the comparative example.

FIGS. 6A, 6B and 6C illustrate light conversion in the light-emitting modules 1A, 1B and 101 respectively. In other words, FIG. 6A illustrates the first example, FIG. 6B illustrates the second example, and FIG. 6C illustrates the comparative example. FIGS. 7A, 7B and 7C illustrate spectral distributions of the light-emitting modules 1A, 1B and 101 respectively. In other words, FIG. 7A illustrates the first example, FIG. 7B illustrates the second example, and FIG. 7C illustrates the comparative example. In FIGS. 7A, 7B and 7C radiant intensity is indicated on a vertical axis and light wavelength is indicated on a horizontal axis. As illustrated in FIG. 6A, in the light-emitting module 1A relating to the first example, a portion of blue light emitted from the LEDs 13 is emitted externally from the light-emitting module 1A without being converted. Another portion of blue light emitted from the LEDs 13 is absorbed by the wavelength converter 25A, and is emitted externally from the light-emitting module 1A after being converted by the wavelength converter 25A to long wavelength band light (cross-hatched arrow in FIG. 6A), which is light in a wavelength band from 540 nm to 780 nm. Another portion of blue light emitted from the LEDs 13 is absorbed by the wavelength converter 35A, and is emitted externally from the light-emitting module 1A after being converted by the wavelength converter 35A to short wavelength band light (dotted arrow in FIG. 6A), which is light in a wavelength band from 480 nm to 630 nm. Before the long wavelength band light (cross-hatched arrow in FIG. 6A) is emitted externally from the light-emitting module 1A, light in the wavelength band from 570 nm to 590 nm is absorbed from among the long wavelength band light by neodymium oxide. White light which is emitted externally from the light-emitting module 1A relating to the first example is a mixture of the blue light, the short wavelength band light and the long wavelength band light.

A spectral distribution illustrated in a left section of FIG. 7A is a schematic representation of the spectral distributions "k–1" (k=1, 2, 3, 4) illustrated in FIG. 4A. In other words, the left section of FIG. 7A illustrates a spectral distribution when the wavelength converter 35A, which includes a short wavelength phosphor but not neodymium oxide, is used. A spectral distribution illustrated in a central section of FIG. 7A is a schematic representation of the spectral distributions "k–2" (k=5, 6, 7, 8) illustrated in FIG. 5A. In other words, the central section of FIG. 7A illustrates a spectral distribution when the wavelength converter 25A, which includes both a long wavelength phosphor and neodymium oxide, is used. A spectral distribution illustrated in a right section of FIG. 7A is a schematic representation of a spectral distribution of white light extracted from the light-emitting module 1A.

As illustrated in FIG. 7A, the spectral distribution of white light extracted from the light-emitting module 1A has a shape which results from addition of the spectral distribution for the configuration in which the wavelength converter including the long wavelength phosphor and neodymium oxide is used, and the spectral distribution for the configuration in which the wavelength converter including the short wavelength phosphor but not neodymium oxide is used.

On the other hand, as illustrated in FIG. 6C, in the light-emitting module 101 relating to the comparative example, a portion of blue light emitted from the LEDs 13 is emitted externally from the light-emitting module 101 without being converted. Another portion of blue light emitted from the LEDs 13 is absorbed by the wavelength converter 125 and is emitted externally from the light-emitting module 101 after being converted by the wavelength converter 125 to light (cross-hatched arrow in FIG. 6C) which is a mixture of long wavelength band light in the wavelength band from 540 nm to 780 nm, and short wavelength band light in the wavelength band from 480 nm to 630 nm. Before the long wavelength band light is emitted externally from the light-emitting module 101, light in the wavelength band from 570 nm to 590 nm is absorbed from among the long wavelength band light by the neodymium oxide. Also, before the short wavelength band light is emitted externally from the light-emitting module 101, light in the wavelength band from 515 nm to 535 nm and light in the wavelength band from 570 nm to 590 nm is absorbed from among the short wavelength band light by the neodymium oxide. Thus, white light which is emitted externally from the light-emitting module 101 relating to the present comparative example is a mixture of the blue light, the long wavelength band light and the short wavelength band light.

A spectral distribution illustrated in a left section of FIG. 7C is a schematic representation of the spectral distributions "k-2" (k=1, 2, 3, 4) illustrated in FIG. 4A. A spectral distribution illustrated in a central section of FIG. 7C is a schematic representation of the spectral distributions "k-2" (k=5, 6, 7, 8) illustrated in FIG. 5A. A spectral distribution illustrated in a right section of FIG. 7A is a schematic representation of a spectral distribution of white light extracted from the light-emitting module 101A.

As illustrated in FIG. 7C, the spectral distribution of white light extracted from the light-emitting module 101 has a shape which results from addition of the spectral distribution for a configuration in which a wavelength converter including a short wavelength phosphor and neodymium oxide is used, and the spectral distribution for a configuration in which a wavelength converter including a long wavelength phosphor and neodymium oxide is used.

Comparison of FIGS. 7A and 7C illustrates that in the light-emitting module 1A relating to the first example, there is no reduction in radiant intensity in the wavelength band from 515 nm to 535 nm, and reduction in radiant intensity close to the wavelength band from 570 nm to 590 nm is suppressed relative to in the light-emitting module 101 relating to the comparative example. The above effect is due to the short wavelength band light emitted from the wavelength converter 35A not being affected by light-absorption by the neodymium oxide. Furthermore, an integrated value of radiant intensities over different wavelengths is increased in the light-emitting module 1A relating to the first example, compared to in the light-emitting module 101 relating to the comparative example. In other words, the light-emitting module 1A has an improved light-extraction efficiency compared to the light-emitting module 101.

(Saturation of White Light Emitted from the Light-Emitting Module Relating to the First Example)

The following explains saturation of white light emitted from the light-emitting module 1A relating to the first example.

Figure 8:
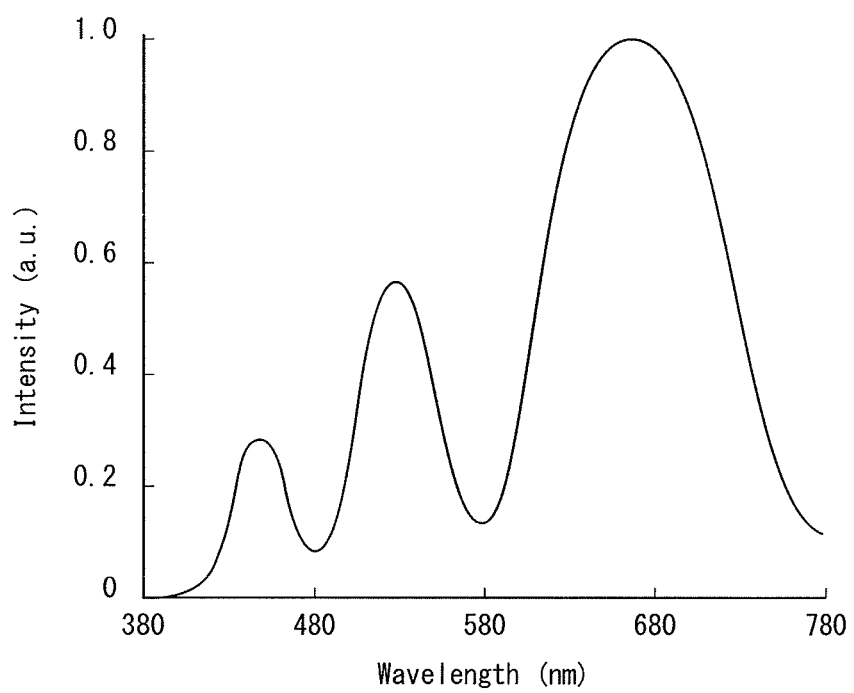
FIG. 8 illustrates a spectral distribution of ideal light having a high FCI value.

FIG. 8 illustrates a spectral distribution for ideal white light having a high saturation.

The white light has a color temperature of 2989 K and an FCI value of 171. FCI is an indicator of how much an illuminated object optically stands out (saturation). FCI is calculated based on size of color areas of four test colors which are represented using a color system based on a non-linear color perception model (for example, refer to Japanese Patent Application Publication No. H11-73923). More specifically, using a red test color as a standard, a gamut area of the four test colors (red, yellow, green and blue) is defined as a sum total of an area surrounded by red, blue and green test colors and an area surrounded by red, yellow and green test colors. FCI is calculated based on the gamut area of the four test colors using MATH 1 shown below.

[MATH 1]

$$FCI = \left[\frac{G(S,1000(lx))}{G(D65,1000(lx))}\right]^{1.6} \times 100 \quad (1)$$

In MATH 1 "G(S,1000(lx))" represents gamut area of the four test colors when irradiated by white light of illumination 1000 lx from a light source S, which is an evaluation target for FCI. "G(D65,1000(lx))" represents gamut area of the four test colors when irradiated by white light of illumination 1000 lx from a standard light source D65. As can be seen from MATH 1, when the gamut area of the four test colors for the light source S has the same area as the gamut area of the four test colors for the standard light source 65, in other words when the same feeling of contrast is obtained from both the light source S and the standard light source D65, white light emitted from the light source S has an FCI value of 100. As the FCI increases, the feeling of contrast (saturation) of objects illuminated by the light source increases, such as a green color of leaves or flowers.

In other words, the closer a spectral distribution of white light emitted from a light-emitting module is to the spectral distribution of ideal white light illustrated in FIG. 8, the more an FCI value of the emitted white light improves. A feature of the spectral distribution of ideal white light is a large decrease in radiant intensity which occurs in the wavelength band from 570 nm to 590 nm.

Figure 9:
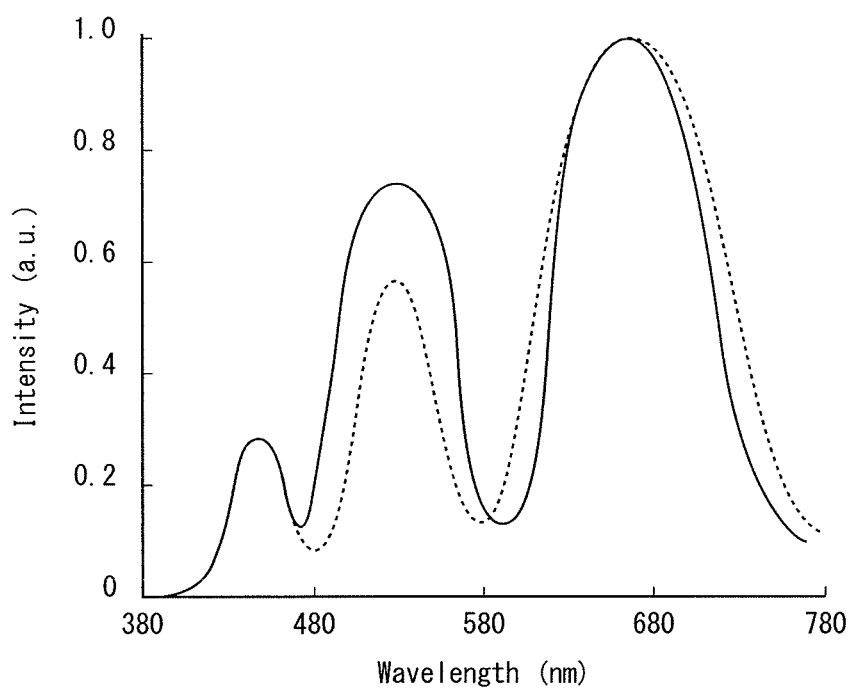
FIG. 9 illustrates a spectral distribution of white light emitted from the light-emitting module relating to the first example of the first embodiment.

FIG. 9 illustrates a spectral distribution of white light emitted from the light-emitting module 1A relating to the first example. In FIG. 9, the spectral distribution of white light emitted from the light-emitting module 1A is indicated by an unbroken line and the spectral distribution of ideal white light illustrated in FIG. 8 is indicated by a dashed line. As illustrated in FIG. 9, the spectral distribution of white light emitted from the light-emitting module 1A is similar to the spectral distribution of ideal white light in terms that decreased radiant intensity occurs in the wavelength band from 570 nm to 590 nm.

As a result of test simulations, it was found that in a light-emitting module in which neither the wavelength converter 25A nor the wavelength converter 35A includes neodymium oxide, white light emitted from the light-emitting module has an FCI value of 141. Consequently, in the first example having a configuration in which the wavelength converter 25A includes neodymium oxide, white light can be emitted which has an FCI value greater than 141. Note that the aforementioned FCI value is greater than for the standard light source D65 which has an FCI value of 100.

[Second Example]
(Structure)

In the light-emitting module 1B relating to the second example the wavelength converter 25B includes a short wavelength phosphor and neodymium oxide. The wavelength converter 35B includes a long wavelength phosphor. A thickness T1 of the wavelength converter 25B is set as approximately the same as a thickness T2 of the wavelength converter 35B. Concentration of the short wavelength phosphor in the wavelength converter 25B is set in a range of 20% to 30% by weight, and concentration of the long wavelength phosphor in the wavelength converter 35B is set in a range of 1% to 2% by weight. Concentrations of the long wavelength phosphor and the short wavelength phosphor which are described above are for a configuration in which a color temperature of 3000 K is set for white light emitted from the light-emitting module 1B. In a configuration in which color temperature of white light emitted from the light-emitting module 1B is for example set as 5000 K or 6500 K, preferably the aforementioned concentrations should be altered. The long wavelength phosphor and the short wavelength phosphor are phosphors such as described in the first example; therefore, detailed explanation is omitted.

(Light-Extraction Efficiency of the Light-Emitting Module Relating to the Second Example As illustrated in FIG. 6B, in the light-emitting module 1B relating to the second example, a portion of blue light emitted from the LEDs 13 is emitted externally from the light-emitting module 1B unconverted. Another portion of blue light emitted from the LEDs 13 and absorbed by the wavelength converter 2513 is emitted externally from the light-emitting module 1B after being converted to short wavelength band light (dotted arrow in FIG. 6B), which is light in the wavelength band from 480 nm to 630 nm. Another portion of light emitted from the LEDs 13 and absorbed by the wavelength converter 35B is emitted externally from the light-emitting module 1B after being converted to long wavelength band light (cross-hatched arrow in FIG. 6B), which is light in the wavelength band from 540 nm to 780 nm. Before the short wavelength band light (dotted arrow in FIG. 6B) is emitted externally from the light-emitting module 1B, light in the wavelength band from 515 nm to 535 nm and light in the wavelength band from 570 nm to 590 nm is absorbed from among the short wavelength light by the neodymium oxide. Consequently, white light extracted from the light-emitting module 1B relating to the second example is a mixture of the blue light emitted from the LEDs 13, the long wavelength band light and the short wavelength band light.

A spectral distribution illustrated in a left section of FIG. 7B is a schematic representation of the spectral distributions "k-2" (k=1, 2, 3, 4) illustrated in FIG. 4A. In other words, the spectral distribution is for a configuration in which the wavelength converter 25B, including both the short wavelength phosphor and neodymium oxide, is used. A spectral distribution illustrated in a central section of FIG. 7B is a schematic representation of the spectral distributions "k-1" (k=5, 6, 7, 8) illustrated in FIG. 5A. In other words, the spectral distribution is for a configuration in which the wavelength converter 35B, including the long wavelength phosphor but not neodymium oxide, is used. A spectral distribution illustrated in a right section of FIG. 7B is a schematic representation of a spectral distribution of white light extracted from the light-emitting module 1B.

As illustrated in FIG. 7B, the spectral distribution of white light extracted from the light-emitting module 1B relating to the second example has a shape which results from addition of the spectral distribution for a configuration in which the wavelength converter including the long wavelength phosphor but not neodymium oxide is used, and the spectral distribution for the configuration in which the wavelength converter including both the short wavelength phosphor and neodymium oxide is used. A portion of the short wavelength band light emitted from the short wavelength phosphor is used as excitation light by the long wavelength phosphor. Therefore, in reality intensity of the long wavelength band light is slightly higher than indicated by the spectral distribution resulting from addition of the aforementioned spectral distributions.

As illustrated in FIGS. 7B and 7C, in the light-emitting module 1B relating to the second example, decreased radiant intensity in the wavelength band from 570 nm to 590 nm is suppressed relative to the light-emitting module 101 relating to the comparative example. The above effect is due to the long wavelength band light emitted from the wavelength converter 35B not being affected by light-absorption by the neodymium oxide. Furthermore, an integrated value of radiant intensities over different wavelengths is increased in the light-emitting module 1B relating to the second example, compared to in the light-emitting module 101 relating to the comparative example. In other words, the light-emitting module 1B has an improved light-extraction efficiency compared to the light-emitting module 101 relating to the comparative example.

(Saturation of White Light Emitted from the Light-Emitting Module Relating to the Second Example)

The following explains saturation of white light emitted from the light-emitting module 1B relating to the second example.

Figure 10:
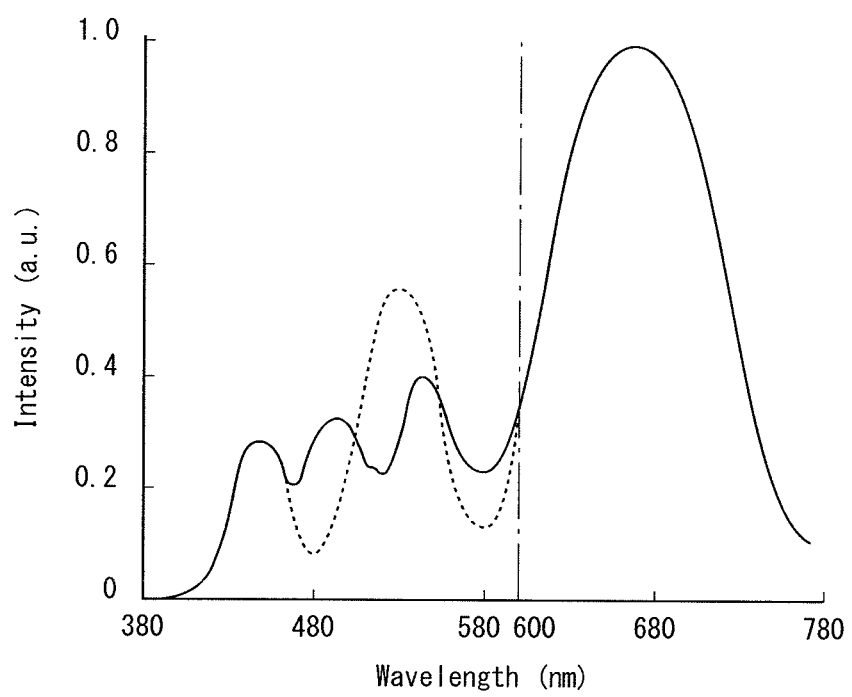
FIG. 10 illustrates a spectral distribution of white light emitted from the light-emitting module relating to the second example of the first embodiment.

FIG. 10 illustrates a spectral distribution of white light emitted from the light-emitting module 1B relating to the second example. In FIG. 10, the spectral distribution of white light emitted from the light-emitting module 1B is indicated by an unbroken line and the spectral distribution of ideal white light illustrated in FIG. 8 is indicated by a dashed line. As illustrated in FIG. 10, the spectral distribution of white light emitted from the light-emitting module 1B is similar to the spectral distribution of ideal white light in terms that decreased radiant intensity occurs in the wavelength band from 570 nm to 590 nm.

As a result of test simulations, it was found that in a light-emitting module in which neither the wavelength converter 25B nor the wavelength converter 35B includes neodymium oxide, white light emitted from the light-emitting module has an FCI value of 131. Consequently, in the second example having a configuration in which the wavelength converter 25B includes neodymium oxide, white light can be emitted which has an FCI value greater than 131. Note that the aforementioned FCI value is greater than for the standard light source D65 which has an FCI value of 100.

(Conclusion)

In summary, in the light-emitting module 1 relating to the present embodiment, neodymium oxide which absorbs light in at least the wavelength band from 570 nm to 590 nm, is present between the wavelength converter 35 and the LEDs 13, the wavelength converter 35 not containing the neodymium oxide. Consequently, among light emitted from the LEDs 13, light which is converted by the wavelength converter 35 is extracted externally from the light-emitting module 1 without being absorbed by the neodymium oxide. On the other hand, among light emitted from the LEDs 13 and converted by the wavelength converter 25, light in at least the wavelength band from 570 nm to 590 nm is absorbed by the neodymium oxide, and light in other wavelength bands is extracted externally from the light-emitting module 1. An effect of the above is that light extraction efficiency can be improved by an amount in accordance with an amount of light which is converted by the wavelength converter 35 and extracted externally from the light-emitting module 1 without being absorbed by the neodymium oxide. Furthermore, by absorbing light in at least the wavelength band from 570 nm to 590 nm from among light converted by the wavelength converter 25, decrease in saturation of white light extracted from the light-emitting module 1 can be suppressed by an amount in accordance with the aforementioned light-absorption.

A wavelength band of light emitted from the wavelength converter 25, which includes neodymium oxide, differs in the first example and the second example. In the first example, the wavelength converter 25A emits long wavelength band light (light in a wavelength band from 540 nm to 780 nm). In contrast, in the second example, the wavelength converter 25B emits short wavelength band light (light in a wavelength band from 480 nm to 630 nm). On the other hand, neodymium oxide has a property of absorbing light in two different wavelength bands; the wavelength band from 515 nm to 535 nm and the wavelength band from 570 nm to 590 nm.

In the light-emitting module 1A relating to the first example, neodymium oxide is included in the wavelength converter 25A, which emits long wavelength band light, but is not included in the wavelength converter 35A. In other words, the neodymium oxide is present between the LEDs 13 and the wavelength converter 35A, which emits short wavelength band light. As a consequence, the long wavelength band light emitted from the wavelength converter 25A is affected by light-absorption by the neodymium oxide, but the short wavelength band light emitted from the wavelength converter 35A is not affected by light-absorption by the neodymium oxide. Therefore, the spectral distribution of white light emitted from the light-emitting module 1A relating to the first example, which is indicated by the unbroken line in FIG. 9, only exhibits decreased radiant intensity, due to light-absorption by the neodymium oxide, in the wavelength band from 570 nm to 590 nm which is included within the wavelength band of the long wavelength band light.

On the other hand, in the light-emitting module 1B relating to the second example, neodymium oxide is included in the wavelength converter 25B, which emits short wavelength band light, but is not included in the wavelength converter 35B. In other words, the neodymium oxide is present between the LEDs 13 and the wavelength converter 35B, which emits long wavelength band light. As a consequence, the short wavelength band light emitted from the wavelength converter 25B is affected by light-absorption by the neodymium oxide, but the long wavelength band light emitted from the wavelength converter 35B is not affected by light-absorption by the neodymium oxide. Therefore, the spectral distribution of white light emitted from the light-emitting module 1B relating to the second example, which is indicated by the unbroken line FIG. 10, exhibits decreased radiant intensity, due to light-absorption by the neodymium oxide, in the wavelength band from 515 nm to 535 nm and also in the wavelength band from 570 nm to 590 nm which are both included within the wavelength band of the short wavelength band light.

In other words, for white light emitted from the light-emitting module 1A relating to the first example, radiant intensity is only decreased in one wavelength band due to light-absorption by the neodymium oxide. In contrast to the above, for white light emitted from the light-emitting module 1B relating to the second example, radiant intensity is decreased in two wavelength bands due to light-absorption by the neodymium oxide. Consequently, light extraction efficiency of the first example is improved in comparison to the second example by an amount in accordance with the number of wavelength bands in which radiant intensity is decreased, due to light-absorption by neodymium oxide, being lower.

Furthermore, in the light-emitting module 1B relating to the second example, optical loss of the short wavelength band light occurs due to a portion of the short wavelength band light emitted from the wavelength converter 25B being absorbed by the wavelength converter 35B. In contrast to the above, in the light-emitting module 1A relating to the first example, the long wavelength band light emitted from the wavelength converter 25A is extracted externally from the light-emitting module 1A without being absorbed by the wavelength converter 35A. Therefore, light-extraction efficiency of the light-emitting module 1A relating to the first example can also be improved, compared to the light-emitting module 1B relating to the second example, through the effect described above.

As explained further above, if the first example has a configuration in which the wavelength converter 25A does not include neodymium oxide, white light is emitted which has an FCI value of 141. On the other hand, if the second example has a configuration in which the wavelength converter 25B does not include neodymium oxide, white light is emitted which has an FCI value of 131. In other words, a configuration relating to the first example emits white light with a higher FCI value than a configuration relating to the second example, regardless of whether neodymium oxide is included. Thus, if neodymium oxide is added to the wavelength converter 25A in the first example and the wavelength converter 25B in the second example in order to raise FCI values of emitted white light in both of the examples to a same arbitrary value, an amount of neodymium oxide that needs to be added is lower in the first example than in the second example. In other words, white light having a high FCI value (saturation) can be achieved through the light-emitting module 1A using a smaller amount of neodymium oxide than through the light-emitting module 1B. Therefore, the light-emitting module 1A enables reduced material costs relative to the light-emitting module 1B.

White light emitted from the light-emitting module 1 relating to the present embodiment is a mixture of light emitted from the LEDs 13, light emitted from the wavelength converter 25, and light emitted from the wavelength converter 35. Light emitted from the wavelength converter 25 is affected by light-absorption by the neodymium oxide, but light emitted from the wavelength converter 35 is not affected by light-absorption by the neodymium oxide. Thus, if radiant intensity of light emitted from the wavelength converter 35 is increased in the wavelength band from 570 nm to 590 nm, radiant intensity of white light emitted from the light-emitting module 1 is also increased in the wavelength band from 570 nm to 590 nm by an amount in accordance therewith. Unfortunately, the above causes a decrease in FCI (saturation) of the emitted white light.

Therefore, from a point of view of suppressing decrease in FCI (saturation), preferably the phosphor included in the wavelength converter 35 should be a phosphor which has a low radiant intensity in the wavelength band from 570 nm to 590 nm. Furthermore, through use of a phosphor which has low radiant intensity in the wavelength band from 570 nm to 590 nm, but has high radiant intensity in other wavelength bands, light extraction efficiency can be improved while also suppressing decrease in FCI.

<Second Embodiment>

Figure 11A:
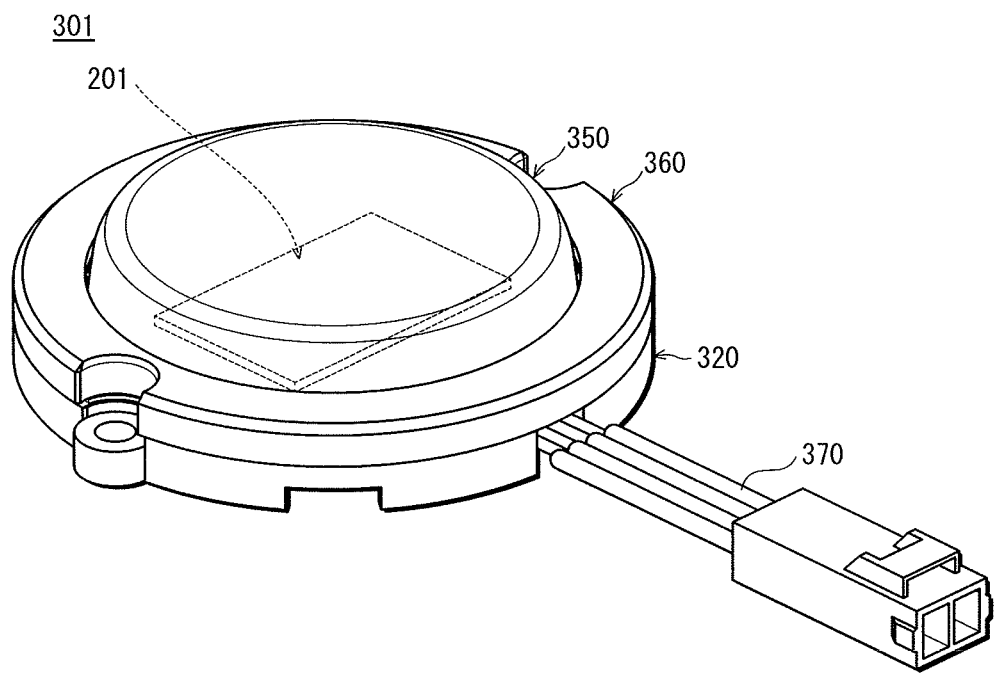
FIG. 11A is a perspective diagram illustrating a lamp unit relating to a first example of a second embodiment.
Figure 11B:
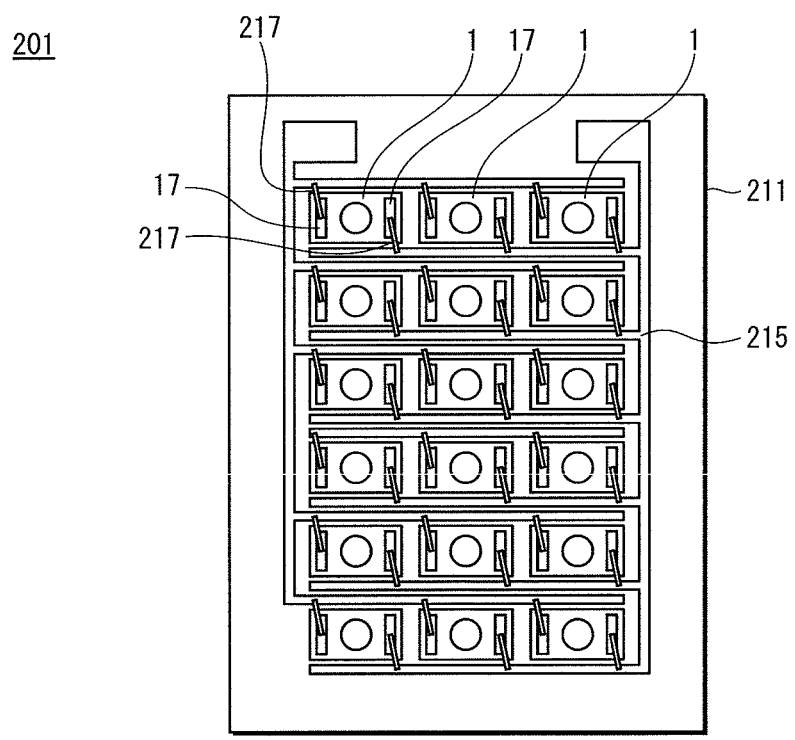
FIG. 11B is a plan-view diagram of a light-emitting unit which is included in the lamp unit illustrated in FIG. 11A.

FIG. 11A is a perspective diagram illustrating a lamp unit which is one example of a lighting source relating to a first example of a second embodiment. FIG. 11B is a plan-view diagram illustrating a light-emitting unit included in the lamp unit illustrated in FIG. 11A.

A lamp unit 301 includes a light-emitting unit 201, a base 320, a cover 350, a cover pressing member 360 and a wiring part 370.

The light-emitting unit 201 is attached to the base 320. The light-emitting unit 201 includes a wiring substrate 211 on which a wiring pattern 215 is formed, and a plurality of the light-emitting modules 1 explained in the first embodiment which are mounted on top of the wiring substrate 211. The electrode pads 17 of the light-emitting modules 1 are electrically connected to the wiring pattern 215 by wires 217. A surface of the wiring substrate 211 of the light-emitting unit 201 on which the light-emitting modules 1 are arranged is covered by the cover 350. The cover pressing member 360 fixes a circumferential edge of the cover 350 to the base 320, thus fixing the cover 350 to the base 320. The cover 350 is made of a light-transmitting material such as a silicone resin, acrylic resin or glass. Light emitted from the light-emitting modules 1 passes through the cover 350 and is extracted externally from the lamp unit 301. The wiring part 370, which is for supplying electrical power to the light-emitting modules 1, is guided out from the base 320.

Figure 12:
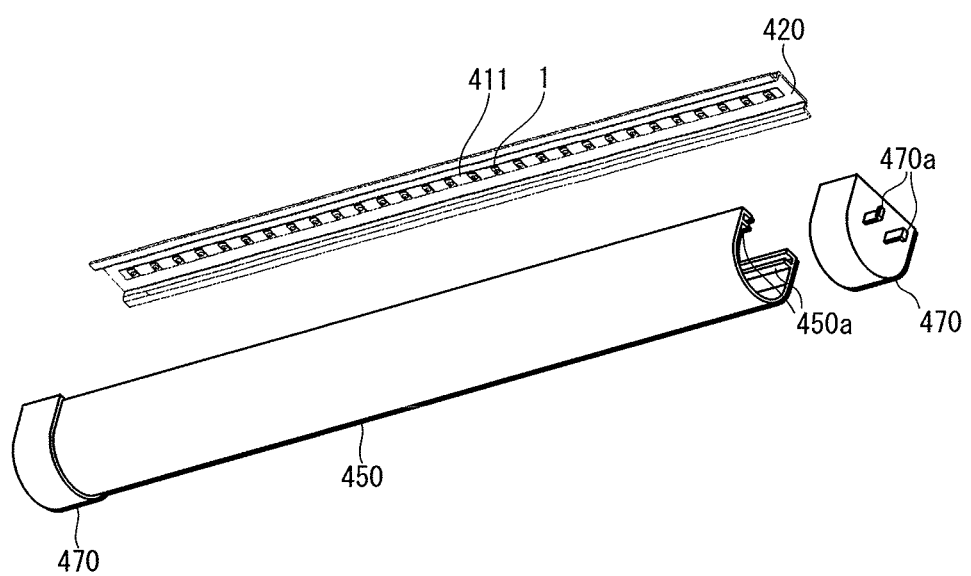
FIG. 12 is an exploded perspective diagram illustrating a lamp unit relating to a second example of the second embodiment.

FIG. 12 is an exploded perspective diagram illustrating a lamp unit relating to a second example of the second embodiment.

A lamp unit 401 includes a plurality of the light-emitting modules 1, a wiring substrate 411, and heat-conducting plate 420, a cover 450 and base caps 470. The light-emitting modules 1 are attached to the wiring substrate 411, and are arranged in a row along the wiring substrate 411 which has an elongated shape. The wiring substrate 411 is attached to the heat-conducting plate 420 which also has an elongated shape. The heat-conducting plate 420 is formed from a rectangular metal sheet (for example, an aluminum sheet or a chromium-free zinc coated steel sheet) which is bent at both edges thereof in terms of a width direction thereof. The cover 450 is made of a light-transmitting material such as an acrylic resin. The cover 450 includes a pair of ribs 450a which are each formed in a longitudinal direction along the cover 450. The heat-conducting plate 420 is fixed to the cover 450 with each of the edges of the heat-conducting plate 420 in terms of the width direction fitted into a corresponding one of the ribs 450a of the cover 450. One of the base caps 470 is attached to one end of the heat-conducting plate 420 and the cover 450 in terms of the longitudinal direction thereof, and the other of the base caps 470 is attached to the other end of the heat-conducting plate 420 and the cover 450 in terms of the longitudinal direction thereof. Through the above configuration, the light-emitting modules 1 are contained in a space which is surrounded by the heat-conducting plate 420, the cover 450 and the base caps 470.

<Modified Examples>

(1) In the first embodiment a configuration was explained in which the light-absorbing substance is located within the wavelength converter 25, but the light-absorbing substance is not limited to the aforementioned location. The light-absorbing substance may be located differently, so long as the light-absorbing substance is located between the LEDs 13 and the wavelength converter 35 in an optical pathway along which light emitted from the LEDs 13 passes.

Figure 13A:
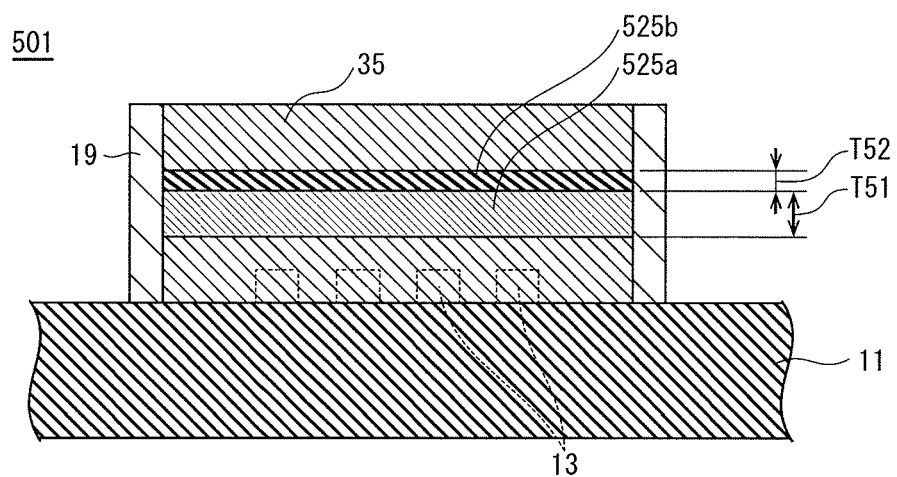
FIG. 13A is a cross-sectional diagram of a light-emitting module relating to a modified example.
Figure 13B:
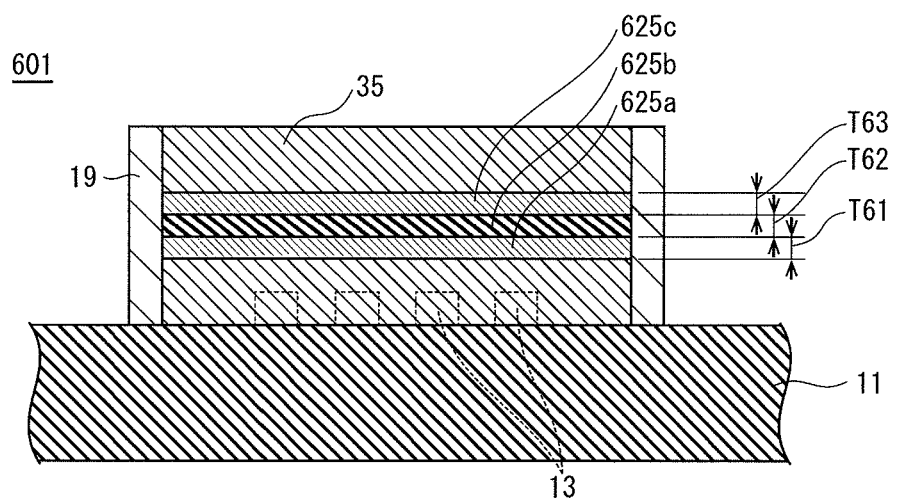
FIG. 13B is cross-sectional diagram of a light-emitting module relating to a modified example.

FIGS. 13A and 13B are cross-sectional diagrams respectively illustrating light-emitting modules 501 and 601 relating to the present modified example. Configuration elements which are the same as in the first embodiment are labeled using the same reference signs and explanation thereof is omitted.

As illustrated in FIG. 13A, in the light-emitting module 501, a light-absorbing member 525b is located between a wavelength converter 525a and a wavelength converter 35.

The wavelength converter 525a includes a light-transmitting base material and a phosphor which is dispersed within the light-transmitting base material. The wavelength converter 525a does not include a light-absorbing substance (neodymium oxide). The light-absorbing member 525b includes a light-transmitting base material and a light-absorbing substance (neodymium oxide) which is dispersed within the light-transmitting base material.

In the above configuration, a spectral distribution of white light emitted from the light-emitting module 501 can be adjusted by altering phosphor concentration and thickness T51 of the wavelength converter 525a, and also by altering neodymium oxide concentration and thickness T52 of the light-absorbing member 525b.

Through the present configuration, the wavelength converter 525a and the light-absorbing member 525b may for example be formed from different materials, thus enabling variations in a method for manufacturing the light-emitting module 501.

As illustrated in FIG. 13B, in the light-emitting module 601 a light-absorbing member 625b including neodymium oxide is located between a wavelength converter 625a and a wavelength converter 625c. The wavelength converters 625a and 625c each include a light-transmitting base material and a phosphor which is dispersed within the light-transmitting base material. The wavelength converters 625a and 625c do not include a light-absorbing substance. The light-absorbing member 625b includes a light-transmitting base material and a light-absorbing substance which is dispersed within the light-transmitting base material. A wavelength converter 35 is located on an opposite side of the wavelength converter 625c to the light-absorbing member 625b. Light emitted from the wavelength converter 625c is emitted externally from the light-emitting module 601 without being affected by light-absorption by the neodymium oxide.

In the above configuration, a spectral distribution of white light emitted from light-emitting module 601 can be adjusted by altering phosphor concentration of the wavelength converters 625a and 625c, and thicknesses T61 and T63 of the wavelength converters 625a and 625c respectively. The spectral distribution can also be adjusted by altering neodymium oxide concentration and thickness T62 of the light-absorbing member 625b.

An advantageous effect of configuration of the light-emitting module 601 illustrated in FIG. 13B, compared to configuration of the light-emitting module 501 illustrated in FIG. 13A, is that a greater number of parameters can be altered in order to adjust the spectral distribution of the emitted white light, thus enabling white light to be obtained which has a desired spectral distribution.

Alternatively, in the configurations illustrated in FIGS. 13A and 13B, the light-absorbing members 525b and 625b respectively may include a phosphor. In the configuration illustrated in FIG. 13A, the wavelength converter 525a is located in contact with the light-absorbing member 525b, and in the configuration illustrated in FIG. 13B, the wavelength converters 625a and 625c are located in contact with the light-absorbing member 625b, but it is not essential that the aforementioned elements are in contact with one another. Alternatively, the wavelength converter 525a may be separated from the light-absorbing member 525b, and likewise the wavelength converters 625a and 625c may be separated from the light-absorbing member 625b.

(2) In the first embodiment, an example was explained in which the wavelength converters 25 and 35 each include either a long wavelength phosphor or a short wavelength phosphor. However, the wavelength converters 25 and 35 are not limited to including the aforementioned phosphors, and may for example alternatively include an orange phosphor.

The orange phosphor may for example be a silicate phosphor such as $(Sr,Ca)_2SiO_4:Eu^{2+}$, a garnet phosphor such as $Gd_3Al_5O_{12}:Ce^{3+}$, or an α-sialon phosphor such as Ca-α-SiAlON:$Eu^{2+}$.

The present configuration enables a larger number of variations in color temperature of white light emitted from the light-emitting module.

(3) In the first embodiment, an example was explained in which thickness T1 of the wavelength converter 25 is set as approximately the same as thickness T2 of the wavelength converter 35, and a ratio of intensities of light emitted from the wavelength converters 25 and 35 is adjusted by altering phosphor concentrations of the wavelength converters 25 and 35. However, a method of adjusting the ratio of intensities of light emitted from the wavelength converters 25 and 35 is not limited to the above. For example, in an alternative configuration, phosphor concentration of the wavelength converter 25 may be set as approximately the same as phosphor concentration of the wavelength converter 35, and the ratio of intensities of light emitted from the wavelength converters 25 and 35 may be adjusted by altering thickness T1 of the wavelength converter 25 and thickness T2 of the wavelength converter 35.

Through the present configuration, adjustment to a desired ratio of intensities can be achieved during manufacture of the wavelength converters 25 and 35 simply by setting appropriate thicknesses for cutting sheets of the wavelength converters 25 and 35 from a base material, which forms a basis for the wavelength converters 25 and 35, thus allowing use of a common base material.

(4) In the first embodiment, an example was explained in which the two wavelength converters 25 and 35 are located such as to overlap with one another in the light-emitting module 1. However, the wavelength converters are not limited to the locations in the above configuration.

Figure 14:
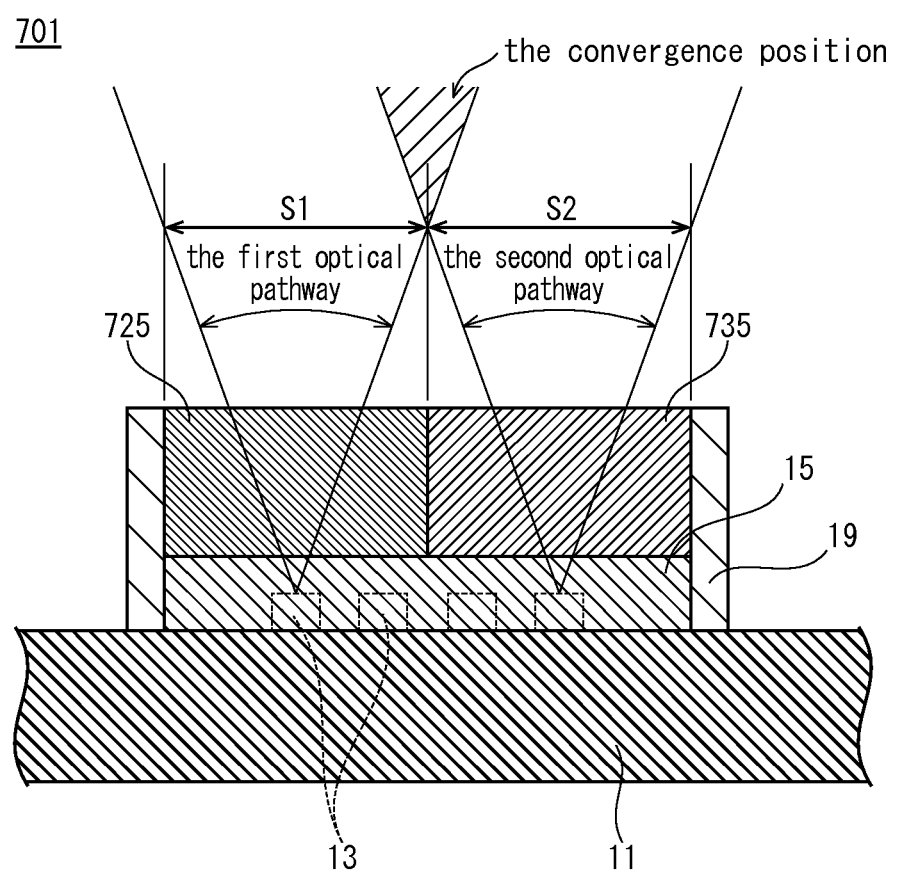
FIG. 14 is a cross-sectional diagram of a light-emitting module relating to a modified example.

FIG. 14 is a cross-sectional diagram of a light-emitting module 701 relating to the present modified example.

In the light-emitting module 701, wavelength converters 725 and 735, which are of two different types, are located adjacently to one another. In other words, the wavelength converter 725 is located such as to cover one part of a region surrounding LEDs 13, and the wavelength converter 735 is located such as to cover another part of the region surrounding the LEDs 13, which differs from the one part of the region covered by the wavelength converter 725. Through the above configuration, one portion of light emitted from the LEDs 13 is incident on the wavelength converter 725, and light which is not incident on the wavelength converter 725, among light emitted from the LEDs 13, is incident on the wavelength converter 735. In other words, the wavelength converter 725 is located in a first optical pathway along which one portion of light emitted from the LEDs 13 passes, and the wavelength converter 735 is located in a second optical pathway along which a remaining portion of light emitted from the LEDs 13 passes.

In the same way as in the first embodiment, the LEDs 13 emit blue light in a wavelength band from 440 nm to 460 nm. The wavelength converter 725 converts at least part of the one portion of blue light emitted from the LEDs 13 to light in a first visible wavelength band. More specifically, the wavelength converter 725 includes a light-transmitting base material and a phosphor (for example, a long wavelength phosphor) which is dispersed within the light-transmitting base material. The wavelength converter 725 also includes neodymium oxide, which is one example of a light-absorbing substance. On the other hand, the wavelength converter 735 converts at least part of the remaining portion of blue light emitted from the LEDs 13 to light in a second visible wavelength band. More specifically, the wavelength converter 735 includes a light-transmitting base material and a phosphor (for example, a short wavelength phosphor) which is dispersed within the light-transmitting base material. In the present configuration, white light is obtained as a result of mixing of blue light, light converted by the wavelength converter 725, and light converted by the wavelength converter 735 at an emission side of the light-emitting module 701. In other words, the first optical pathway and the second optical pathway converge at a convergence position which in terms of the first optical pathway is on an opposite side of the wavelength converter 725 to the LEDs 13, and in terms of the second optical pathway is on an opposite side of the wavelength converter 735 to the LEDs 13. Furthermore, a light scattering member may be included in the light-emitting module 701 at a location downstream of the convergence position in order to promote mixing of light.

A spectral distribution of white light emitted from the light-emitting module 701 can be adjusted by altering phosphor concentration, neodymium oxide concentration and area S1 of the wavelength converter 725, and also by altering phosphor concentration and area S2 of the wavelength converter 735. Herein, the area of each of the wavelength converters 725 or 735 refers to area of a two dimensional shape of the wavelength converter 725 or 735 when viewed in a thickness direction of substrate 11.

(5) In the first embodiment, an example was explained in which the wavelength converters 25 and 35, which are two different types, are located above the sealing member 15, but inclusion of the sealing member 15 is not essential. In an alternative configuration, among two wavelength converters of different types, at least one of the wavelength converters may seal the LEDs 13.

Figure 15A:
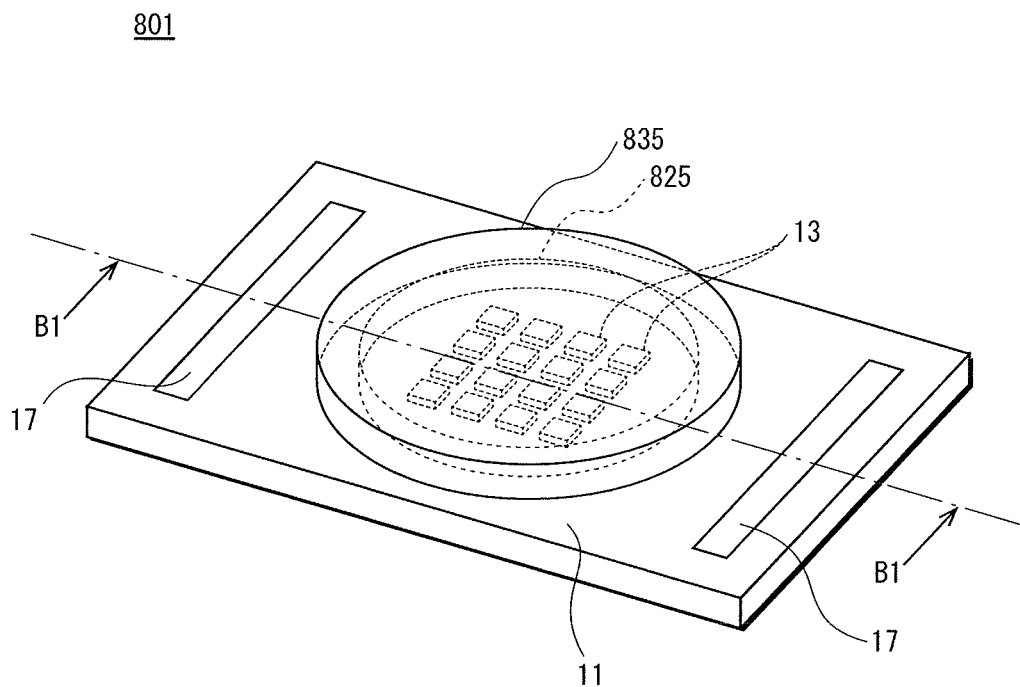
FIG. 15A is a perspective diagram illustrating a light-emitting module relating to a modified example.
Figure 15B:
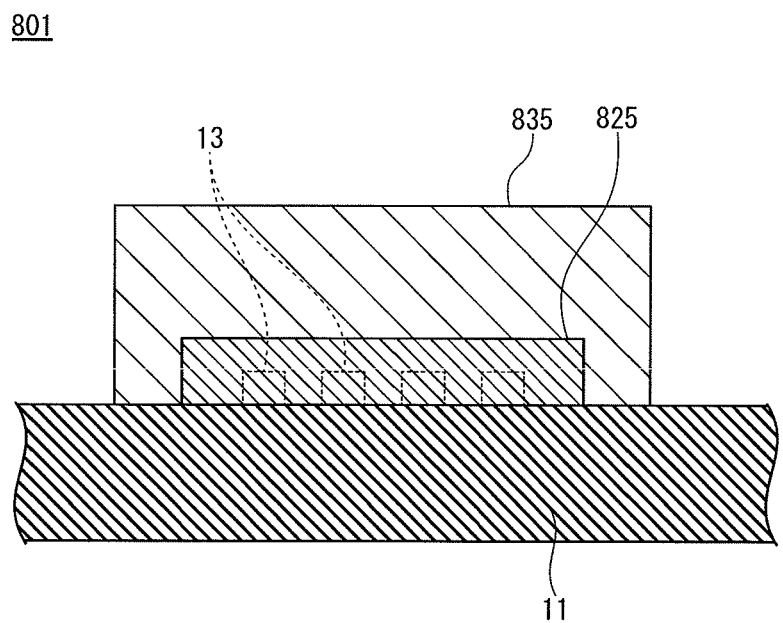
FIG. 15B illustrates, for the light-emitting module illustrated in FIG. 15A, one part of a cross-section B1-B1 indicated in FIG. 15A.

FIG. 15A is a perspective diagram illustrating a light-emitting module 801 relating to the present modified example. FIG. 15B illustrates, for the light-emitting module illustrated in FIG. 15A, one part of cross-section B1-B1 indicated in FIG. 15A. Configuration elements which are the same as in the first embodiment are labeled using the same reference signs and explanation thereof is omitted.

In the light-emitting module 801, a wavelength converter 825 is located such as to seal LEDs 13. The wavelength converter 825 includes a light-transmitting base material, and also a phosphor and neodymium oxide, which are dispersed within the light-transmitting base material. A wavelength converter 835 is located around an outer surface of the wavelength converter 825, such that the wavelength converter 835 covers all regions of the wavelength converter 825 which are not in contact with a substrate 11. The wavelength converter 835 includes a light-transmitting base material and a phosphor which is dispersed within the light-transmitting base material.

Through the present configuration, inclusion of a transparent sealing member can be omitted, thus enabling reduction in size of the light-emitting module 801 and also enabling simplification of manufacture of the light-emitting module 801 due to reduction in the number of components thereof.

(6) In the first embodiment, an example was explained in which the wavelength converters 25 and 35, which are of two different types, are located in the light-emitting module 1 such that the wavelength converters 25 and 35 both cover all of the LEDs 13. However, the above is not a limitation on configuration, and in an alternative configuration two wavelength converters of different types may each cover a different plurality of LEDs 13.

Figure 16:
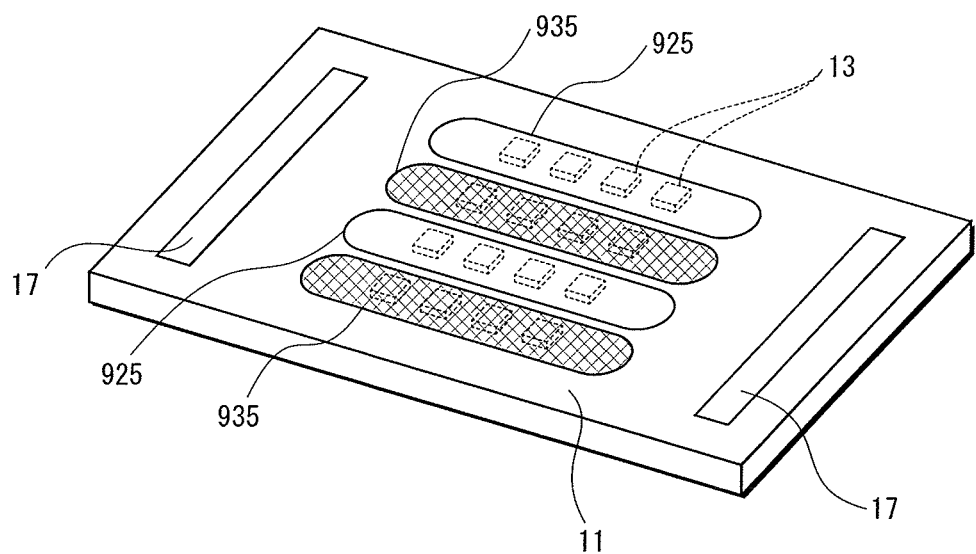
FIG. 16 is a perspective diagram of a light-emitting module relating to a modified example.

FIG. 16 is a perspective diagram illustrating a light-emitting module 901 relating to the present modified example. Configuration elements which are the same as in the first embodiment are labeled using the same reference signs and explanation thereof is omitted.

In the light-emitting module 901, wavelength converters 925 and 935 are located such as to each seal a different plurality of LEDs 13. The wavelength converter 925 converts a portion of blue light emitted from corresponding LEDs 13 to light in a first visible wavelength band. More specifically, the wavelength converter 925 includes a light-transmitting base material and a phosphor (for example, a long wavelength phosphor) which is dispersed within the light-transmitting base material. The wavelength converter 925 also includes neodymium oxide, which is one example of a light-absorbing substance. The wavelength converter 935 converts a portion of blue light emitted from corresponding LEDs 13 to light in a second visible wavelength band. More specifically, the wavelength converter 935 includes a light-transmitting base material and a phosphor (for example, a short wavelength phosphor) which is dispersed within the light-transmitting base material.

Through the present configuration, a number of the LEDs 13 which are covered by each of the wavelength converters 925 and 935 can be easily understood when the light-emitting module 901 is viewed in an opposite direction to a direction of light-emission therefrom. Consequently, during production the number of the LEDs 13 covered by each of the wavelength converters 925 and 935 can be easily set, thus enabling simple adjustment of a ratio of light in the short wavelength band to light in the long wavelength band.

(7) In the first embodiment an example was explained of the light-emitting module 1 which is a so called small-size light-emitting module including a rectangular substrate. However, structure of the light-emitting module is not limited to a small-size light-emitting module such as described above.

Figure 17A:
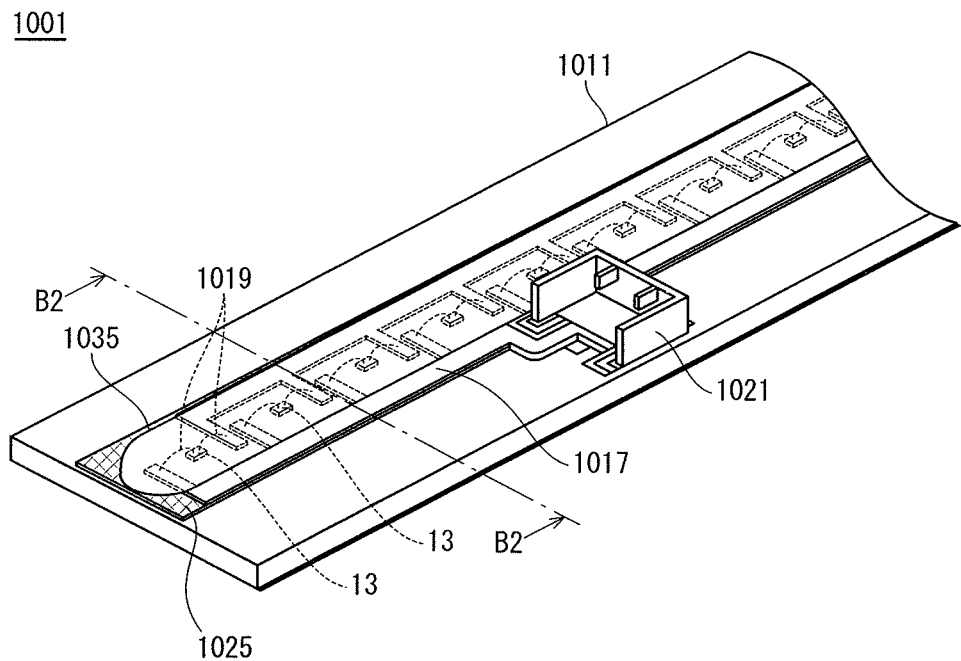
FIG. 17A is a perspective diagram illustrating a light-emitting module relating to a modified example.
Figure 17B:
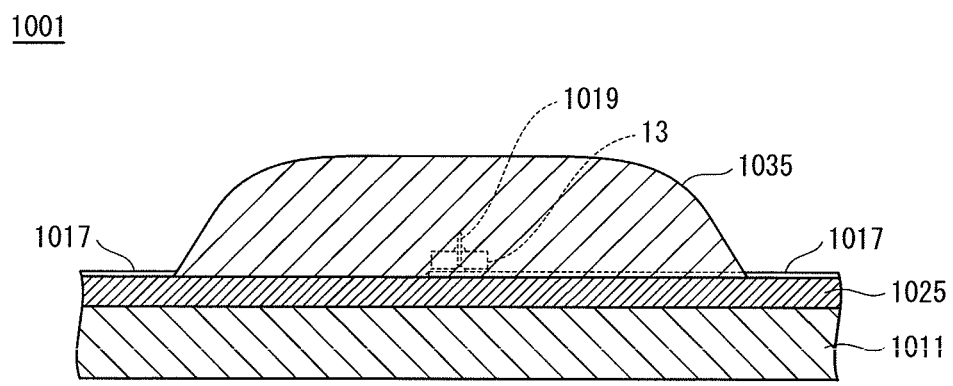
FIG. 17B illustrates, for the light-emitting module illustrated in FIG. 17A, one part of a cross-section B2-B2 indicated in FIG. 17A.

FIG. 17A is a perspective diagram illustrating a light-emitting module 1001 relating to a modified example. FIG. 17B illustrates, for the light-emitting module illustrated in FIG. 17A, one part of cross-section B2-B2 indicated in FIG. 17A. Configuration elements which are the same as in the first embodiment are labeled using the same reference signs and explanation thereof is omitted.

The light-emitting module 1001 includes a light-reflecting substrate 1011, a plurality of LEDs 13, and wavelength converters 1025 and 1035. The substrate 1011 has an elongated shape. The wavelength converter 1025 is formed as an elongated thin film on the substrate 1011. The wavelength converter 1025 is formed on the substrate 1011 using a printing technique, prior to the LEDs 13 being arranged above the substrate 1011. The LEDs 13 are arranged in a single row on the wavelength converter 1025. Wiring 1017 is formed above the substrate 1011 in a comb-like shape in plan-view, such as to partially overlap the wavelength converter 1025. A socket 1021 is located on the substrate 1011. The socket 1021 can be connected to a connector which is connected to an external electrical power supply. Teeth parts of the comb-like shape of the wiring 1017 are each electrically connected at a tip thereof to an electrode (not illustrated) of a corresponding one of the LEDs 13 via a metal wire 1019. The wavelength converter 1035 is located above the wavelength converter 1025 such as to seal the LEDs 13, the metal wires 1019 and also the tips of the teeth parts of the wiring 1017.

The wavelength converter 1025 converts a portion of blue light emitted from the LEDs 13 to light in the first visible wavelength band. More specifically, the wavelength converter 1025 includes a light-transmitting base material and a phosphor (for example, a long wavelength phosphor) which is dispersed within the light-transmitting base material. The wavelength converter 1025 also includes neodymium oxide, which is one example of a light-absorbing substance. The wavelength converters 1035 converts a portion of blue light emitted from the LEDs 13 to light in the second visible wavelength band. More specifically, the wavelength converter 1035 includes a light-transmitting base material and a phosphor (for example, a short wavelength phosphor) which is dispersed within the light-transmitting base material. The light-transmitting base material of the wavelength converter 1025 and the light-transmitting base material of the wavelength converter 1035 may each for example be made of a silicone resin, fluororesin, silicone-epoxy hybrid resin or urea resin.

One portion of blue light emitted from the LEDs 13 travels toward the substrate 1011, is reflected by the substrate 1011, and is extracted externally as reflected-light. A remaining portion of blue light emitted from the LEDs 13 is extracted externally as direct-light without travelling toward the substrate 1011. A portion of the reflected-light is converted to light in the first visible wavelength band by the wavelength converter 1025. A portion of the direct-light is converted to light in the second visible wavelength band by the wavelength converter 1035. Consequently, white light emitted from the light-emitting module 1001 is a mixture of the blue light, the light in the first visible wavelength band and the light in the second visible wavelength band. In other words, in the above configuration the wavelength converter 1025 is located in a first optical pathway along which one portion of light emitted from the LEDs 13 passes, and the wavelength converter 1035 is located in a second optical pathway along which a remaining portion of light emitted from the LEDs 13 passes.

In the present configuration, white light can be obtained as a result of the blue light, the light converted by the wavelength converter 1025, and the light converted by the wavelength converter 1035 mixing in the wavelength converter 1035. In other words, the first optical pathway and the second optical pathway converge at a convergence position, which in terms of the first optical pathway is on an opposite side of the wavelength converter 1025 to the LEDs 13, and which in terms of the second optical pathway is on an opposite side of the wavelength converter 1035 to the LEDs 13.

The present configuration is a linear-type lighting source which can be adopted in a straight-tube type lamp or the like, and implements a linear-type lighting source which emits white light having high saturation.

Also, the present configuration can be implemented simply by using a printing technique to form the wavelength converter 1025 on the substrate 1011 during manufacture of the light-emitting module 1001, prior to arranging the LEDs 13 above the substrate 11. Therefore, the present configuration can be used to simply implement a lighting source which emits white light having high saturation.

The configuration illustrated in FIGS. 17A and 17B, is an example of a configuration in which the wavelength converter 1035 seals the LEDs 13 in the light-emitting module 1001, but the wavelength converter 1035 sealing the LEDs 13 is not a limitation on configuration.

Figure 18A:
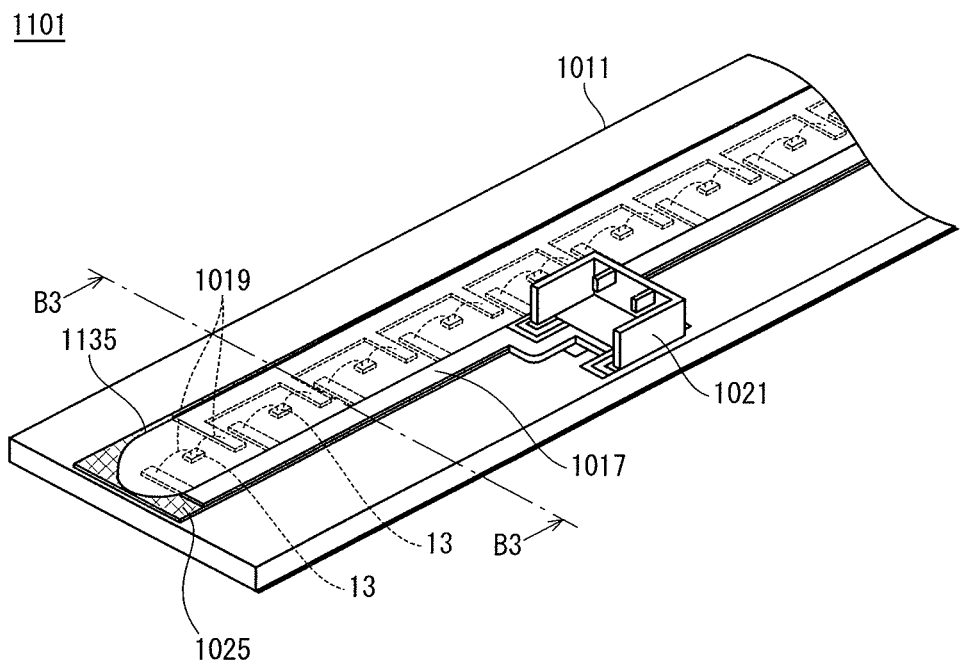
FIG. 18A is a perspective diagram illustrating a light-emitting module relating to a modified example.
Figure 18B:
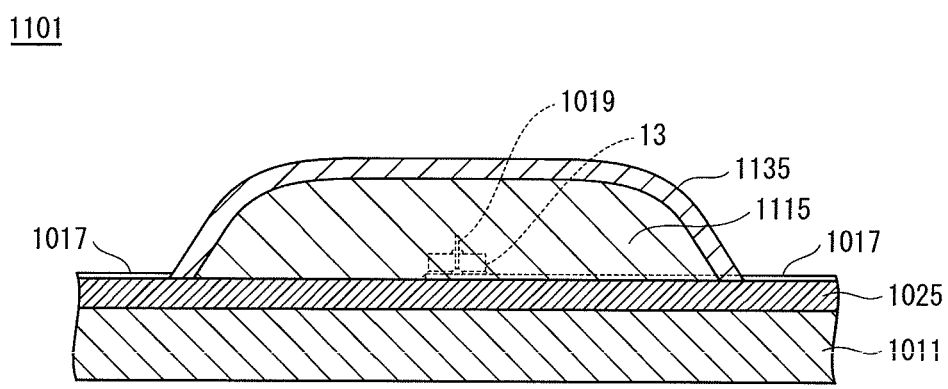
FIG. 18B illustrates, for the light-emitting module illustrated in FIG. 18A, one part of a cross-section B3-B3 indicated in FIG. 18A.

FIG. 18A is a perspective diagram illustrating a light-emitting module 1101 relating to a modified example. FIG. 18B illustrates, for the light-emitting module illustrated in FIG. 18A, one part of cross-section B3-B3 indicated in FIG. 18A. Configuration elements which are the same as in FIGS. 17A and 17B are labeled using the same reference signs and explanation thereof is omitted.

The light-emitting module 1101 includes a sealing member 1115 which has a long, thin shape and which is transparent. The sealing member 1115 collectively seals a plurality of LEDs 13. A wavelength converter 1135, which includes a light-transmitting base material and a phosphor dispersed within the light-transmitting base material, is located such as to cover an outer surface of the sealing member 1115. The sealing member 1115 may for example be made of a silicone resin, fluororesin, silicone-epoxy resin or urea resin.

Through the present configuration, a portion of blue light emitted from the LEDs 13 is incident on the wavelength converter 1025 or 1135 after having been guided along a longitudinal direction of the sealing member 1115. Therefore, the present configuration enables suppression of uneven brightness of white light emitted from the light-emitting module 1101, which may otherwise occur along the longitudinal direction of the wavelength converters 1025 and 1135.

(8) In the first embodiment an example was explained in which an LED is used as a light-emitting element, but the light-emitting element is not limited to being an LED. For example, alternatively the light-emitting element may be any other electroluminescent element which emits blue light.

(9) Alternatively, the first embodiment, the second embodiment and the modified examples described above may be appropriately combined, so long as incompatibility does not arise through such combination.

The invention claimed is:

1. A light-emitting module comprising:
a light emitter configured to emit light;
a first wavelength converter located in an optical pathway along which the light emitted from the light emitter passes, and configured to convert a portion of the light emitted from the light emitter to light in a first visible wavelength band;
a second wavelength converter located in the optical pathway on an opposite side of the first wavelength converter relative to the light emitter, and configured to convert at least a portion of light passing unconverted through the first wavelength converter to light in a second visible wavelength band, differing from the first visible wavelength band; and
a light-absorbing substance absorbing light in at least a wavelength band from 515 nm to 535 nm and a wavelength band from 570 nm to 590 nm from among the light converted by the first wavelength converter, wherein
the light-absorbing substance is present in the optical pathway between the light emitter and the second wavelength converter, the second wavelength converter not containing the light-absorbing substance, and
the light-absorbing substance is a neodymium compound.

2. The light-emitting module of claim 1, wherein
the first wavelength converter includes a first light-transmitting base material and a first phosphor which is dispersed within the first light-transmitting base material, and which converts the light emitted from the light emitter to the light in the first visible wavelength band, and
the second wavelength converter includes a second light-transmitting base material and a second phosphor which is dispersed within the second light-transmitting base material, and which converts the light emitted from the light-emitting module to the light in the second visible wavelength band.

3. The light-emitting module of claim 2, wherein
the light-absorbing substance is dispersed within the first light-transmitting base material.

4. The light-emitting module of claim 1, further comprising
a light absorber located between the first wavelength converter and the second wavelength converter, wherein
the light-absorbing substance is included in the light absorber.

5. The light-emitting module of claim 1, wherein
an amount of the light-absorbing substance which is present in the optical pathway is set based on a target color saturation of white light which is a mixture of the light emitted from the light emitter, the light in the first visible wavelength band, and the light in the second visible wavelength band.

6. The light-emitting module of claim 1, wherein
the light emitted from the light emitter is in a wavelength band from 410 nm to 500 nm, the first visible wavelength band is from 480 nm to 630 nm, and
the second visible wavelength band is from 540 nm to 780 nm.

7. The light-emitting module of claim 1, wherein
the light emitted from the light emitter is in a wavelength band from 410 nm to 500 nm,
the first visible wavelength band is from 540 nm to 780 nm, and
the second visible wavelength band is from 480 nm to 630 nm.

8. A light-emitting module comprising:
a light emitter configured to emit light;
a first wavelength converter located in a first optical pathway along which one portion of the light emitted from the light emitter passes, and configured to convert at least part of the one portion of the light emitted from the light emitter to light in a first visible wavelength band;
a second wavelength converter located in a second optical pathway along which a remaining portion of the light emitted from the light emitter passes, and configured to convert at least part of the remaining portion of the light emitted from the light emitter to light in a second visible wavelength band, being shorter than the first visible wavelength band; and
a light-absorbing substance absorbing light in at least a wavelength band from 515 nm to 535 nm and a wavelength band from 570 nm to 590 nm from among the light converted by the first wavelength converter, wherein
the first optical pathway and the second optical pathway converge at a convergence position that is opposite the first and second wavelength converters relative to the light emitter,
the light-absorbing substance is present in the first optical pathway between the light emitter and the convergence position, the second optical pathway between the light emitter and the convergence position not containing the light-absorbing substance, and
the light-absorbing substance is a neodymium compound.

9. The light-emitting module of claim 8, wherein
the first wavelength converter is located such as to cover one part of a region surrounding the light emitter,
the second wavelength converter is located such as to cover another part of the region surrounding the light emitter, differing from the one part of the region covered by the first wavelength converter, and
the light-absorbing substance is present in the first wavelength converter.

10. The light-emitting module of claim 8, further comprising
a light-reflecting substrate, wherein
the first wavelength converter is located such as to cover the light-reflecting substrate,
the second wavelength converter is located on an opposite side of the first wavelength converter relative to the light-reflecting substrate,
the light emitter is located between the first wavelength converter and the second wavelength converter, and
the light-absorbing substance is present in the first wavelength converter.

11. The light-emitting module of claim 8, wherein
the first wavelength converter includes a first light-transmitting base material and a first phosphor which is dispersed within the first light-transmitting base material, and which converts the light emitted from the light emitter to the light in the first visible wavelength band, and the second wavelength converter includes a second light-transmitting base material and a second phosphor which is dispersed within the second light-transmitting base material, and which converts the light emitted from the light emitter to the light in the second visible wavelength band.

12. The light-emitting module of claim 11, wherein the light-absorbing substance is dispersed within the first light-transmitting base material.

13. The light-emitting module of claim 8, wherein
the light emitted from the light emitter is in a wavelength band from 410 nm to 500 nm,
the first visible wavelength band is from 540 nm to 780 nm, and
the second visible wavelength band is from 480 nm to 630 nm.

14. A lighting source comprising the light-emitting module of claim 1.

15. A lighting source comprising the light-emitting module of claim 8.

16. The light-emitting module of claim 1, wherein
the light emitted from the light emitter is in a wavelength band from 410 nm to 500 nm,
the first visible wavelength band is from 540 nm to 780 nm,
the second visible wavelength band is from 480 nm to 630 nm, and
the light-absorbing substance is a neodymium compound.

17. The light-emitting module of claim 8, wherein
the light emitted from the light emitter is in a wavelength band from 410 nm to 500 nm,
the first visible wavelength band is from 540 nm to 780 nm,
the second visible wavelength band is from 480 nm to 630 nm, and
the light-absorbing substance is a neodymium compound.

* * * * *